US006828963B1

(12) United States Patent
Rappoport

(10) Patent No.: US 6,828,963 B1
(45) Date of Patent: Dec. 7, 2004

(54) PATTERN MATCHING FOR DATA EXCHANGE BETWEEN COMPUTER AIDED DESIGN SYSTEMS

(75) Inventor: Ari Rappoport, Jerusalem (IL)

(73) Assignee: Proficiency Ltd., Jerusalem (IL)

( * ) Notice: Subject to any disclaimer, the term of this patent is extended or adjusted under 35 U.S.C. 154(b) by 862 days.

(21) Appl. No.: 09/660,426

(22) Filed: Sep. 6, 2000

(51) Int. Cl.$^7$ .............................................. G06T 15/00
(52) U.S. Cl. ...................................................... 345/419
(58) Field of Search ................................ 345/418, 419, 345/420, 421, 619, 655

(56) References Cited

U.S. PATENT DOCUMENTS

| | | | | |
|---|---|---|---|---|
| 5,386,500 A | * | 1/1995 | Pomerantz et al. ......... | 345/419 |
| 5,646,862 A | | 7/1997 | Jolliffe et al. .............. | 364/488 |
| 5,717,905 A | | 2/1998 | Iwamoto et al. ............ | 395/500 |
| 5,781,720 A | | 7/1998 | Parker et al. .......... | 395/183.14 |
| 5,815,415 A | | 9/1998 | Bentley et al. ............. | 364/578 |
| 5,870,588 A | | 2/1999 | Rompaey et al. ........... | 395/500 |
| 5,945,995 A | | 8/1999 | Higuchi et al. ............. | 345/420 |
| 6,128,023 A | * | 10/2000 | Kawashima ................ | 345/619 |
| 6,501,822 B2 | * | 12/2002 | Roder ........................ | 378/22 |
| 6,614,430 B1 | * | 9/2003 | Rappoport .................. | 345/420 |

FOREIGN PATENT DOCUMENTS

| | | |
|---|---|---|
| EP | 0 355 167 A1 | 2/1990 |
| WO | WO 95/29440 | 11/1995 |
| WO | WO 99/44107 | 9/1999 |
| WO | WO 02/37406 A1 | 5/2002 |

OTHER PUBLICATIONS

Su et al., An Extensive Knowledge Base Management System for Supporting Rule–Based Interoperability among Heterogeneous Systems., CIKM '95, ACM 6/1995, pp. 1–10.*

Hoffman, Christoph M. and Robert Joan–Arinyo, *On user–defined features*, Computer–Aided Design, vol. 30 No. 5. 1998, pp. 321–332.

Hoffman, Christoph M. and Robert Joan–Arinyo, *CAD and the Product Master Model*, Oct. 7, 1997, pp. 1–32.

Hoffman, Christoph M. and Xiangping Chen, *On editability of feature–based design*, Computer–Aided Design, vol. 27 No. 12, 1995, pp. 905–914.

Hoffman, Christoph M. and Xiangping Chen, *Towards feature attachment*, Computer–Aided Design, vol. 27 No. 9, 1995, pp. 695–702.

Hoffman, Christoph M., Xiangping Chen, and Vasilis Capoyleas, *Generic naming in generative, constraint–based design*, Computer–Aided Design, vol. 28 No. 1, 1996, pp. 17–26.

(List continued on next page.)

*Primary Examiner*—Phu K. Nguyen
(74) *Attorney, Agent, or Firm*—Fish & Richardson P.C.

(57) ABSTRACT

Computer implemented exchange of data between two distinct computer aided design systems is provided. According to one embodiment, the invention is a computer system for exchanging computer aided design data. In this embodiment, the system includes: a source technical system comprising a source computer aided design data model; a knowledge base comprising a plurality of match data records, the match data records having a source operation region, corresponding to the source technical system, and a target operation region; and an executable computer program. According to one embodiment, the executable computer program is configured to retrieve information corresponding to a feature from the source computer aided design data model; query the plurality of match data records based on the retrieved information; and return information corresponding to a particular match data record in the plurality of match data records, the information representing one or more operations for creating an equivalent feature in a distinct computer aided design model to the feature from the source computer aided design data model. Computer implemented methods for pattern matching are also disclosed.

20 Claims, 14 Drawing Sheets

OTHER PUBLICATIONS

Buoma, William, Loannis Fudos, Christoph Hoffman, Jiazhen Cai, and Robert Paige, *Geometric constraint solver, Computer–Aided Design*, vol. 27 No. 6, 1995, pp. 487–501.

Hoffman, Christoph, and Robert Juan, *Erep☐ An Editable, High–Level Representation for Geometric Design and Analysis, Geometric Modeling for Product Realization*, 1993, pp. 129–164.

Hel–Or, Yaacov, Ari Rappoport, and Michael Werman, *Relaxed Parametric Design with Probabilistic Constraints, 2nd ACM Solid Modeling*, 1993, pp. 261–280.

*Engen Final Report*, Nov. 25, 1998, Cooperative Agreement No. N00014–95–2–0013.

Solano, Lluis, and Pere Brunet, *A System for Constructive Constraint–Based Modeling, Modeling in Computer Graphics Methods and Applications*, 1993, pp. 61–83.

Rappoport, Ari, *A Scheme for Single Instance Representation in Hierarchical Assembly Graphs, Modeling in Computer Graphics*, 1993, pp. 213–224.

Kripic, Jiri, *A Mechanism for Persistently Naming Topological Entities in History–based Parametric Solid Models, Solid Modeling*, 1995, pp. 21–30.

Lequette, Remi, *Considerations on Topological Naming, Product Modeling for Computer Integrated Design and Manufacture*, 1997, pp. 394–403.

Han and Requicha, *Modeler–independent feature recognition in a distributed environment, Computer–Aided Design*, GB, Elsevier Science Ltd. Publishers BV, vol. 30, No. 6, pp 453–463 (May 1, 1998).

Kao and Lin, *Development of a collaborative CAD/CAM system, Robotics and Computer Integrated Manufacturing*, GB, Elsevier Science Ltd. Publishers, BV vol. 14, No. 1, pp. 55–68 (Feb. 1, 1998).

Foley, James D., Andries van Dam, Steven K. Feiner, John F. Hughes. *Computer Graphics, Principles and Practice*. 2nd ed. *Addison Wesley*, 2000. pp xvii–xxiii, 1153–1173.

Murray, James D. and William vanRyper. *Graphics File Formats*. 2nd ed. *O'Reilly & Associates, Inc.*, 1996. pp v–xiii, 1099–1116.

Bloor, M. Susan and Jon Owen. *Product Data Exchange. UCL Press: London*, 1995. pp v–xii, 211–214, 259–262.

Shah, Jami J. and Martti Mantyla. *Parametric and Feature–based CAD/CAM. John Wiley & Sons, Inc.*, 1995. xi–xx, 1, 593–619.

Petzold, Charles. *Programming Windows*. 5th ed. *Microsoft Press*, 1999, Contents: 15 pages unnumbered, pp 1437–1479.

Strasser, W., R. Klein, R. Rau, Eds. *Geometric Modeling: Theory and Practice. Springer: Berlin*, 1997. pp vii–ix.

"Method For Cataloging Elements In A Computer Aided Design" IBM Technical Disclosure Bulletin, US, IBM Corp. New York, vol. 36, No. 5, May 1, 1993 pp. 409–410, XP000409039 ISSN: 0018–8689.

Dadam P. et al: "Datenbanksysteme Als Werkzeug Zur Integration Von Cax–Systemen" Automatisierungstechnische Praxis—ATP, DE, Oldenbourg Verlag. Munchen, vol. 31 No. 9, Sep. 1, 1989, pp. 431–438 XP000066116 ISSN: 0178–2320.

Bidarra, R. et al. "Representation and management of feature information in a cellular model," Computer Aided Design, Elsevier Publishers BV, Barking G.B. vol. 30, No. 4, Apr. 1, 1998, pp. 301–313.

Hoffman, C.M. et al. "CAD and the product master model" Computer Aided Design, Elsevier Publishers BV. Barking, GB, vol. 30, No. 11, Sep. 15, 1998, pp. 905–918.

de Kraker, K.J. et al., "Multiple–way feature conversion to support concurrent engineering" Proceedings of the Third Symposium on Solid Modeling and Applications. Salt Lake City, May 17–19, 1995 Proceedings of the Symposium on Solid Modeling and Applications, New York, ACM, US, vol. SYMP. 3, May 17, 1995, pp. 105–114.

Middleditch et al, "A representation independent geometric modeling kernel" Geometric Modeling and Processing 2000. Theory and Applications. Proceedings Hong Kong. China Apr. 10–12, 2000. Los Alamitos, CA USA, IEEE Comput. Soc, US, Apr. 10, 2000, pp. 79–89.

Ragothama S. et al., "Consistent updates in dual representation systems" Computer Aided Design, Elsevier Publishers BV. Barking, GB, vol. 32, No. 8–9, Aug. 2000 (2000–08), pp. 463–477.

Shah, J.J. et al, "Experimental investigation of the STEP form–feature information model" Computer Aided Design, Elsevier Publishers BV. Barking, GB, vol. 23, No. 4, May 1, 1991, pp. 282–296.

* cited by examiner

PATTERN MATCHING FOR DATA EXCHANGE BETWEEN COMPUTER AIDED DESIGN SYSTEMS

CROSS-REFERENCE TO RELATED APPLICATIONS

This application is related to U.S. patent application Ser. Nos. 09/655,540, entitled "DATA EXCHANGE BETWEEN COMPUTER AIDED DESIGN SYSTEMS", 09/655,546, entitled "USER EMULATION FOR COMPUTER AIDED DESIGN DATA EXCHANGE", 09/655,547, entitled "METHOD AND APPARATUS FOR EDGE CORRELATION BETWEEN DESIGN OBJECTS", and PCT International Application Ser. No. PCT/US00/25618, entitled "PATTERN MATCHING FOR DATA EXCHANGE BETWEEN COMPUTER AIDED DESIGN SYSTEMS", all filed Sep. 6, 2000. This application is also related to U.S. patent application Ser. No. 09/391,311, filed Sep. 7, 1999, entitled, "METHOD AND SYSTEM FOR THE EXCHANGE OF CAD DATA", U.S. Provisional Application Ser. No. 60/099,340, filed Sep. 8, 1998, entitled, "DATA EXCHANGE IN MECHANICAL COMPUTER-AIDED DESIGN". All of these applications are incorporated herein by reference in their entirety.

BACKGROUND

1. Field of the Invention

This application is related to computer data exchange, and more particularly to techniques for matching patterns in distinct computer aided design systems.

2. Background Information

Modern engineers, and in particular engineers who design mechanical devices, utilize computer aided design equipment to assist in the design process. This equipment typically consists of a UNIX-based, or Microsoft Windows NT (TM)-based workstation or computer that includes a keyboard, a display, and a pointing device, such as a mouse. More particularly, the equipment includes computer aided design (hereinafter "CAD") software that allows the engineer to create two- or three-dimensional drawings of the devices the engineer designs.

Occasionally the CAD software does more than simply allow the engineer to create drawings of these devices. The CAD software might also perform various solid modeling and/or engineering manufacturing based analysis on the engineer's CAD model, as well as certain supply chain functionalities—for example by integrating the CAD model into a sophisticated product data management ("PDM"), manufacturing resource planning. ("MRP"), or enterprise resource planning ("ERP") database system.

There are two standard paradigms in which engineers enter data into a CAD system. For the sake of simplicity, one paradigm will be referred to as the "explicit geometry" paradigm and the second will be referred to as the "parametric feature-based" paradigm. FIG. 1 shows an explicit geometry system, while FIG. 2 shows a parametric feature-based system.

In legacy CAD systems, explicit geometric specification of parts is performed. For example, images are created, sometimes in different layers, where rectangular or polar coordinates are specified for each point or line. While this method is cumbersome and painstakingly detailed, it is often a preferred data entry paradigm for engineers who design complex free-form surfaces. The strength of this paradigm is also its weakness: namely, the rigid and often unforgiving interdependencies between edges, connections, voids, and spatial geometry. For instance, moving a single line or point can disrupt the entire model.

In the not too distant past, a new approach to CAD design, called parametric feature-based ("PFB") design was introduced. Parametric feature-based design is currently the leading design paradigm in the CAD industry. In this paradigm, which has been pioneered by companies such Parametric Technology Corporation ("PTC"), rather than explicitly reciting geometric points and the like, engineers start with certain shapes and define parameters for those shapes. Subsequent features are added to the shape that, when aggregated, form a complete CAD model. Referring to FIG. 2, it shows an exemplary feature list 4 for an object and the resulting sketch 8 of the object.

For instance, if an engineer were designing a new wheel for a car, she might start with a circle. Next, a feature is added to the circle making it a cylinder (e.g. an extrude operation). A shell could then be subtracted from the cylinder, thereby creating and overall contour for the visible part of the wheel. Finally, an array of small diameter cylinders could also be subtracted from the visible part of the wheel to create openings through which the wheel can be attached to the car. With each of the features added to the design, the engineer specifies a basic geometry and one or more parameters for the geometry (for example, radius, length, width, depth, material, etc.). In a competitive system, however, more complex shapes may be modeled. For instance, rather than starting with a baseline geometric feature, the competitive CAD system may allow cylinders, cones, or other complex three-dimensional features to be specified.

The strength of parametric feature-based design is that the engineer's design intent can be maintained, even though the details (parameters) change. This is to say that the overall design is preserved while giving the engineer the flexibility to simply test different parameters on her design. For instance, small changes to a feature on a PFB CAD model will not necessarily disrupt the stability of the entire design.

As of this writing, there are a number of major vendors of CAD software, and even more smaller vendors. These vendors include: PTC, Dassault Systemes (France), Unigraphics Solutions, SDRC, and Autodesk. Each of these vendors implements their design methodologies in a different manner and most treat their. computational and algorithmic methodologies as proprietary. Not only are their methodologies secret, but the data structures that implement their methodologies are secret.

And herein lies a problem. When the users of different CAD systems need to share design data they are currently able to do so only to a limited extent. Typically the extent to which the users are able to share data is limited by the amount of cooperation between the various CAD vendors. Because the CAD vendors are head-to-head competitors, they share information only reluctantly—lest their trade secrets or proprietary methodologies, which are the very core element that distinguishes vendor from vendor (apart from their user interface), become known by their competitors.

Nevertheless, the CAD vendors have implemented certain application programming interfaces ("APIs") that provide at least a partial solution to the problem. Using an API, a user or system integrator can make function calls to a particular CAD system together with the necessary processing information. The particular CAD system will process the function calls and may return either an explicit geometric expression of the desired part or feature, or it may return some sort of standard graphical representation of the desired part or feature.

But the APIs are functionally limited and often have significant problems exchanging complex design features and/or information. And again, every additional function added to a CAD vendor's API provides a window through which the vendor's competitors can view, with an eye to reverse engineering, at least some portion of the vendor's trade secrets.

The problem is getting worse. Consolidation in certain industries, such as the automotive and aircraft industries, creates more CAD data exchange problems. For instance, Boeing Corporation recently acquired McDonnell Douglas Corporation. The formerly separate entities likely use different CAD systems. Moreover, each formerly separate entity has multiple tiers of suppliers—each supplier using their own CAD system too. When an engineer at Boeing changes a part, that change must be communicated to the particular supplier that manufactures the part. The supplier may require the CAD model for the part. But because of incompatible file types and differing computational and algorithmic methodologies, the CAD model cannot be provided. Even worse, when Boeing decides to create design synergies between the two merged entities, the Boeing engineers and the McDonnell Douglas engineers might be completely unable to exchange complex CAD models. Of course, the same is true of Ford Motor Company, which recently purchased Jaguar and Volvo. FIG. 3 diagrammatically presents the communication problem.

The economies of scale desired by the merger of such entities are victims of the inevitable battles over sharing information and know-how between the CAD vendors. Moreover, the collaboration between engineers from separate entities (i.e., between original equipment manufacturers and first and second tier suppliers), under the current state-of-the-art, will be all but impossible—as engineers waste time and money desperately trying to share design files made from disparate CAD systems. While standards may exist for exchanging raw data images (e.g., TIFF and JPEG) and boundary representations (e.g., IGES and STEP), these standards do not preserve the design intent of the engineer.

SUMMARY OF THE INVENTION

Computer implemented exchange of data between two distinct computer aided design systems is provided. According to one embodiment, the invention is a method comprising the steps of: selecting a particular operation from a feature list of a source computer aided design system; comparing the particular operation to a match data record from a database, the match data record comprising an operation corresponding to the source computer aided design system and one or more operations corresponding to a target computer aided design system; and storing information corresponding to the match data record in a memory, the information representing a match with the particular operation from the feature list, wherein the match data record is used as a basis to construct a feature list for the target computer aided design system.

According to another embodiment, the invention is a technical system for exchanging computer aided design data. The. technical system can comprise: a source technical system having a source computer aided design data model; a knowledge base comprising a plurality of match data records, the match data records having a source operation region, corresponding to the source technical system, and a target operation region; and an executable computer program configured to: retrieve information corresponding to a feature from the source computer aided design data model; query the plurality of match data records based on the retrieved information; and return information correspondingto a particular match data record in the plurality of match data records, the information representing one or more operations for creating an equivalent feature in a distinct computer aided design model to the feature from the source computer aided design data model.

BRIEF DESCRIPTION OF THE DRAWINGS

The figures in the accompanying drawings depict various elements corresponding to the subject invention. Like reference, numerals in the drawings refer to like elements.

FIG. 6 generally shows the data flow between exemplary system elements; FIG. 7 shows an exemplary data matrix; and FIG. 8 is a flowchart detailing exemplary feature pattern matching operations.

FIG. 9A generally shows a communication overview between exemplary system components; FIG. 9B is a screen shot detailing aspects of selecting an object; FIG. 9C depicts monitoring display control data for changes; FIG. 10A is a flowchart depicting the main steps for user emulation; FIG. 10B is a flowchart detailing exemplary set-up operations; FIG. 10C is a flowchart detailing exemplary element selection operations; and FIG. 10D is a flowchart detailing exemplary verification operations.

FIG. 1A is a perspective view of a source object and an edge; FIG. 11B is a perspective view of the source object with a feature applied to the edge.; FIG. 11C is a perspective view of a target object and an edge; FIG. 11D is a perspective view of the target object with the feature applied to the edge; and FIG. 12 is an operational overview of a computer implemented edge selection process. FIG. 13 is a flowchart depicting a method for detecting whether two edges overlap. FIG. 14 is a diagram of a source edge and a series of target edge candidates that illustrates a technique for determining regions. FIG. 15 is a flowchart depicting an edge containment algorithm. FIG. 16 is a flowchart -depicting a method for detecting an initial edge. FIG. 17 is a flowchart depicting a chain extension algorithm.

DETAILED DESCRIPTION OF THE PREFERRED EMBODIMENTS

Figure 1:
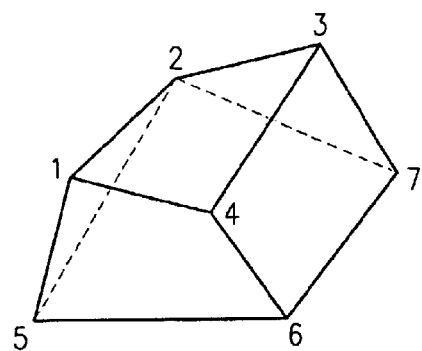
FIG. 1 shows a free-form shape made in an explicit geometry CAD system.
Figure 2:
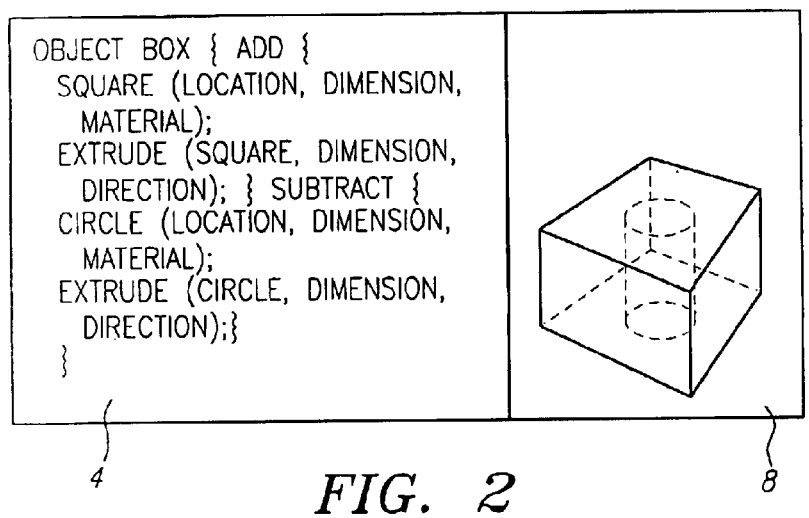
FIG. 2 shows a parametric feature based design CAD system.
Figure 3:
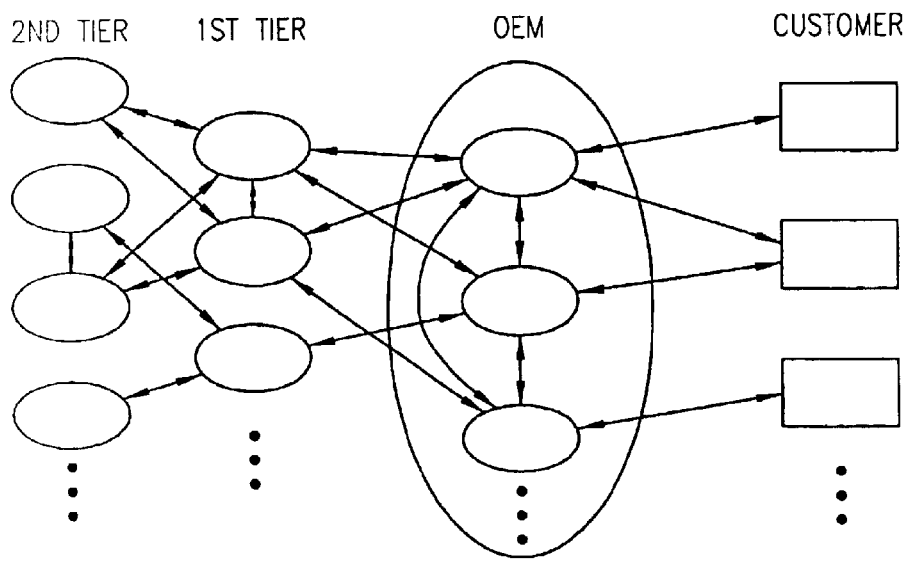
FIG. 3 diagrammatically presents the communication flow between CAD systems.
Figure 4:
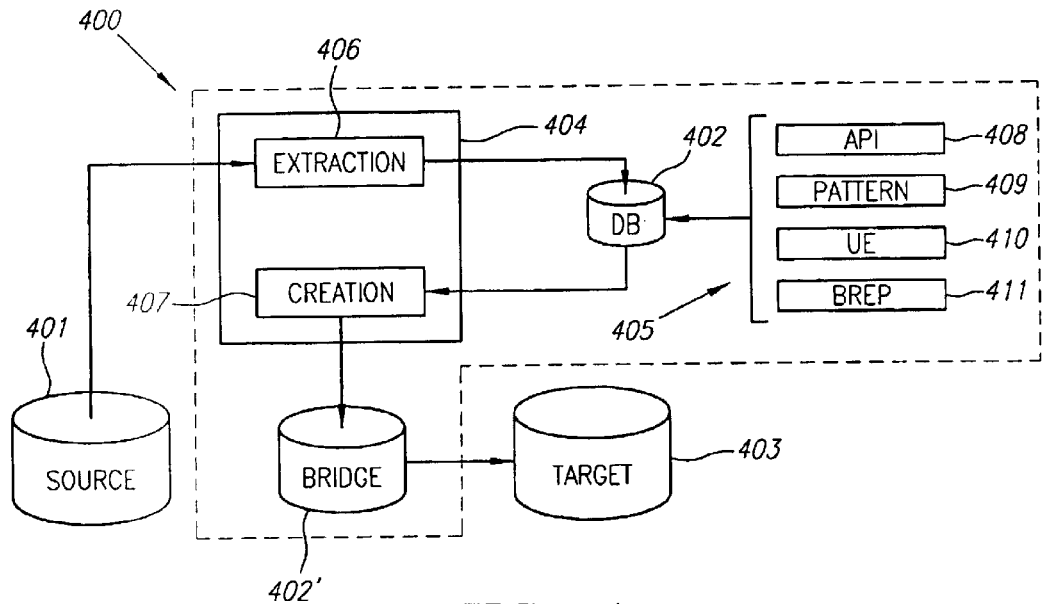
FIG. 4 is a conceptual overview of the invention.

FIG. 4 is a conceptual drawing of an embodiment of the invention. The invention includes a method and system for exchanging computer aided design data from a source computer system 401 to a target computer system 403. Both the source and target computer systems are used in a computer aided design environment. According to one embodiment, an intermediate system 400 provides the functionality to make the conversion from the source 401 to the target 403 systems. An execution area 404 performs two basic functions. First, the execution area 404 extracts CAD data from the source 401. Second, the execution area creates CAD data that can be used by the target 403. In one embodiment, a database 402 provides a knowledge catalogue 405 of operations that can be performed in either the source 401 or target systems to extract and create the CAD data. Included in the knowledge catalogue 405 are a sequence of operations that are used for the conversion processes, the operatibns including an application programmer interface 408, a pattern matching technique 409, a user emulation technique 410, and a boundary representation technique 411.

In one embodiment, a bridge data structure 402' is created by the intermediate system 400. The bridge data structure 402' can be a separately created and persistently stored data structure, or the bridge structure 402' can be a purely temporal data structure that is used and then flushed from memory. If the bridge data structure 402' is a persistent data structure, then it can also be a part of the database 402.

An advantage of creating a persistent bridge data structure 402' is that version and extraction/creation information, such as undo logs or rollback logs, can be created to back-out or re-write changes that fail when the CAD data exchange is taking place, or to recreate a particular instance of the CAD design. Rather than creating a single file for each version of the CAD design, a particular instance can be recreated in an incremental manner, thereby saving disk space. Moreover, preservation of the design intent can be easily maintained, as the database or intermediate data structure can provide an exchange means for preserving the parametrics, features, histories, etc. of the CAD design.

An underlying objective in the data exchange techniques described herein is that the design intent from the source CAD model should be preserved. What this means in practice is that the resultant CAD data structure for the target computer system preserves the ability of a subsequent engineer to manipulate, on a feature by feature basis, the target CAD data structure—just as if the engineer were operating on the source CAD data structure. Of course, this level of manipulation will not always be possible, and indeed it is not even a necessary requirement of the invention, but it is preferred nonetheless.

CAD Data Exchange

Figure 5A:
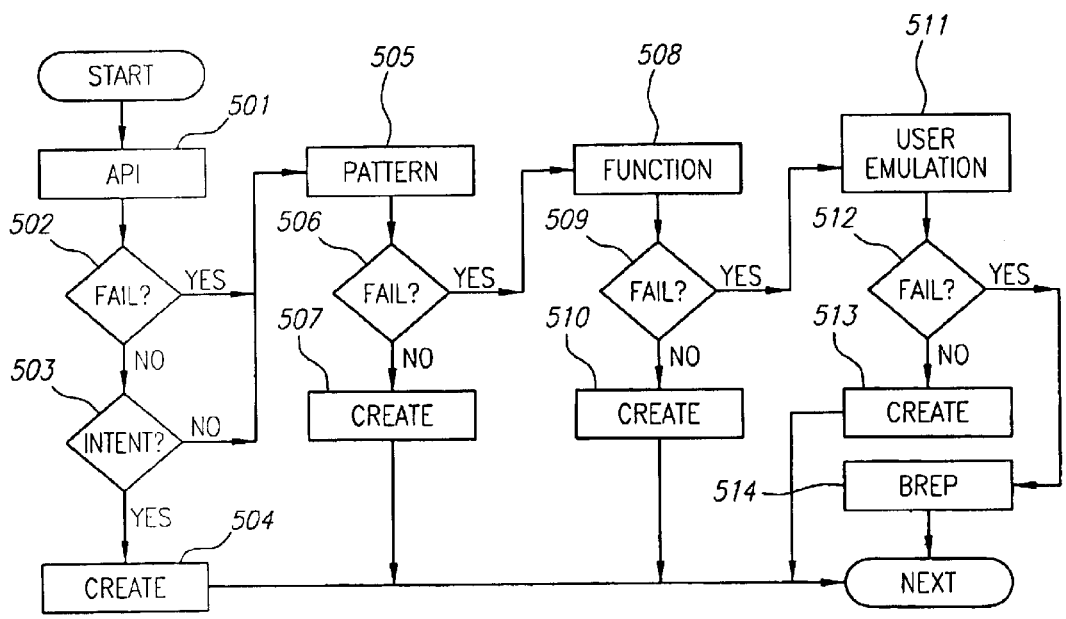
FIG. 5A is a flowchart showing the general operation of the invention.

FIG. 5A is a flowchart depicting CAD data exchange methods according to one embodiment of the invention. As a preliminary note, it may be assumed that the semantics of the source CAD data model are already understood. Furthermore, where a bridge data structure is used, a universal, intermediate CAD data format can be used. Thus knowledge of the source and target CAD systems can be independent of the extraction or creation processes.

In step 501, an application programmer interface ("API") is called on either the source CAD system or the target CAD system. According to one embodiment, the target CAD system API is called first and if the API does not work, then the API on the source CAD system is called. However, in another embodiment, only the API on the target CAD system, or only the API on the source CAD system is called. For instance, if the export process is being performed, only the source CAD system API is used. However, if the import process is being performed, then only the target CAD system API is used.

In step 502, the result of the API is analyzed to determine if a failure has occurred. Generally, the API will return a failure notification, but other times the API failure might cause a sub-system crash, such as a page fault or a general protection fault. Thus, determining if a failure has occurred can include not only monitoring the output of the API, but monitoring performance of various operating parameters of the source and/or target CAD systems, as well as the physical properties of the CAD data objects themselves (e.g., on a feature by feature basis).

Even if the API succeeded as tested in step 502, a second test is performed at step 503 to ensure that the design intent of source CAD data model is preserved when the target CAD data model is created. To this end, testing the design intent involves determining whether a particular target CAD feature can still be modified by an engineer. For instance, a test to determine whether the design intent is preserved is to examine the extent to which boundary representations have been employed in the CAD data model. Typically, when the target CAD data model is all boundary representations, then it is possible that the design intent has not been preserved. However, in some circumstances, a target CAD model can be represented by boundary representations and still partially preserve the design intent, for instance when the boundary representation is created on a feature by feature basis.

If the API successfully preserved the design intent from the source CAD system, then the API is used to create the particular feature for the target CAD system in step 504. If not, or if the API failed as a result of the test at step 502, then a pattern matching technique, which is described in detail below, is performed in step 505.

In general, the pattern matching technique is a method for mapping one or more functions of a particular feature from a source CAD data model into one or more corresponding functions for the target CAD data model. According to one embodiment, the pattern matching technique is used to enforce "best practice" techniques or to enforce certain design constraints. Thus, typically, the pattern matching technique is used to find a coterminous sequences of operations in the source feature list and map them to a desired feature list for a target CAD system, which preserves the design intent. A more specific description of a pattern matching technique is described below with reference to FIGS. 6–8.

In step 506, a test is performed to determine the result of the pattern matching in step 505. The pattern matching failed if no pattern that included a current feature could be matched with a match data record stored in the database. In step 507, assuming a successful pattern match, one or more equivalent operations are created for the target CAD model, or bridge structure as the case may be.

Step 508 shows a function mapping technique. In general, the difference between pattern matching and function matching is that pattern matching maps multiple operations into multiple equivalent operations, while function mapping is generally a one-to-one type matching between operations and does not necessarily enforce any design or practice constraints on the mapping. However, step 508 and any corresponding subsequent operations can be subsumed in the pattern matching technique—the function mapping being a subset of the pattern matching. In step 509, a test is performed to determine whether the function mapping failed to find an equivalent operation. In step 510, if the function mapping was successful, then the equivalent operation is created for the target CAD model.

However, if the function mapping failed, then in step 511, a user emulation technique is performed. In general, the user emulation technique emulates the menu and/or mouse operations of a user of the target CAD system or the source CAD system. For instance, the user emulation technique can be used to detect properties of either the target or source CAD object, or reveal additional attributes or comments concerning a particular feature. The user emulation technique can also be used to extract a particular feature from the source CAD system, or create the equivalent feature in the target CAD system. Specific details of the user emulation techniques are described below with reference to FIGS. 9A–C and 10A–D.

In step 512, a test is performed to determine whether the user emulation technique failed. If the user emulation technique did not fail, then in-step 513, the target CAD model feature is created and the process continues to the next design feature of the source CAD model. However, if the user emulation technique did fail, then in step 514, a boundary representation (that is, an explicit geometry representation, as opposed to a PFB representation) is created. It is generally known in the art how to create a boundary representation (or "brep") of the particular feature. For instance, one or more API functions can be called in the source or target CAD systems to create an exportable brep. While it is generally known how to create a brep, what is unique here is the manner in which target CAD object is created with the brep: according to an embodiment of the invention, the brep of the source CAD object is created until the current feature is inclusive in the brep. Once the current feature is inclusive, then the brep technique 411 can stop creating the target CAD model and subsequent features can be created with other techniques.

After step 514, processing can continue to the next design feature of the source CAD model.

Figure 5B:
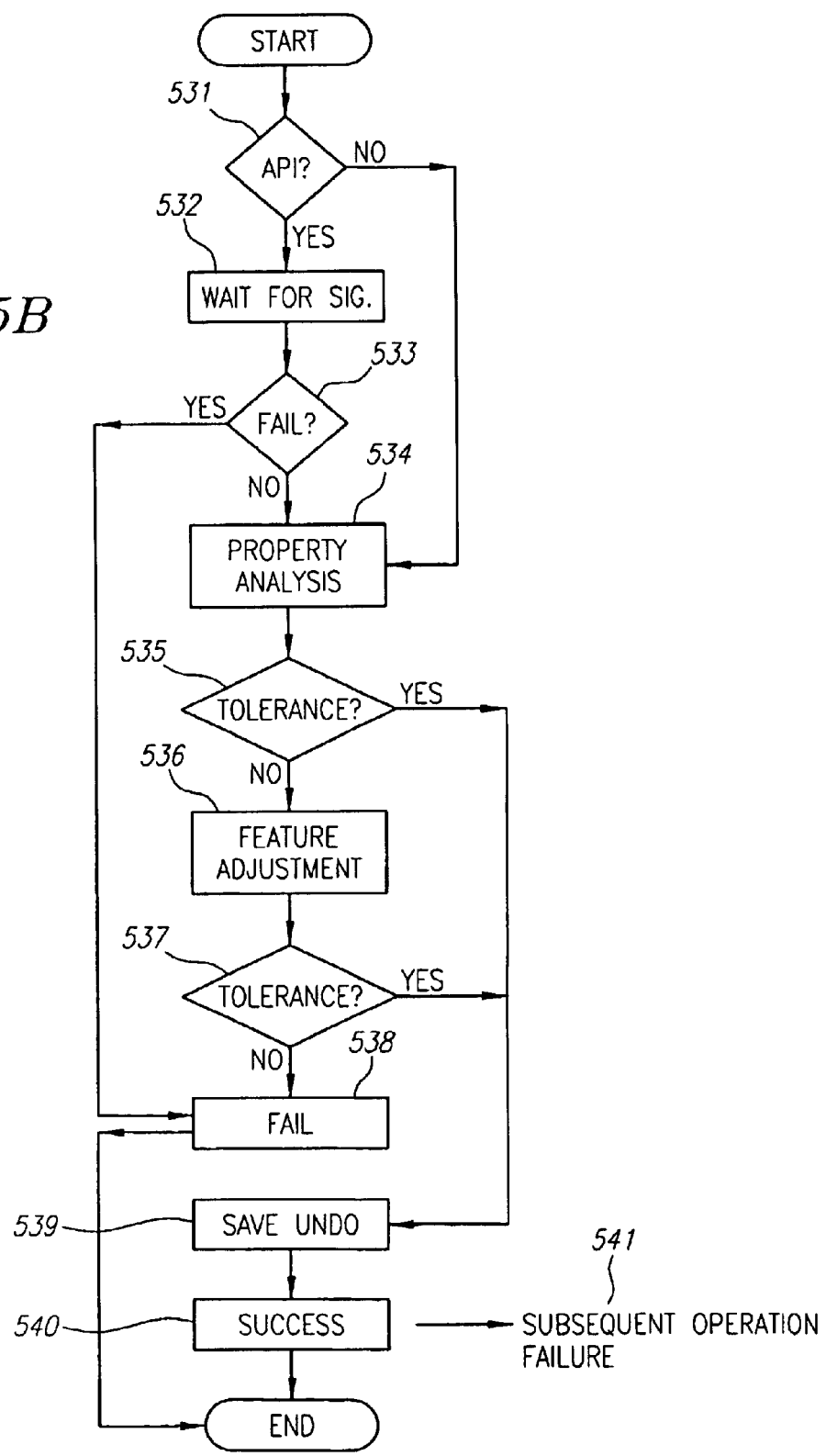
FIG. 5B is a flowchart detailing exemplary failure detection steps.

It is worth mentioning certain failure detection methods that can be performed in accordance with the invention. For this we turn to FIG. 5B.

In step 531, a test is shown that determines whether the failure detection is initialized based upon an API call, or some other operation (e.g., pattern matching, function mapping, user emulation, or brep). If the failure detection process follows an API call, then in step 532 the intermediary system waits for a signal back from the API that is indicative of success or failure of the API call. Otherwise, the process continues to step 534.

In step 533, a test is performed to determine whether the API failed. If the API did fail, then a fail signal is returned to the data exchange process in step 538. If not, then step 534 is performed, which also follows step 531. In step 534, a physical and/or geometric property analysis is undertaken wherein geometric and/or physical properties of the source CAD model are compared with the target CAD model. For instance, a surface area calculation can be performed, a mass or density calculation can be performed, and/or a line or perimeter calculation can be performed. Other solid or geometric modeling calculations can be performed too.

In step 535; the result of the comparison in step 534 is tested against accepted tolerances associated with the target CAD system. It is worth noting that the tolerances can not only be with respect to the source and target CAD model properties, but also just the target CAD object properties with respect to design or feature tolerances corresponding strictly to the target CAD system. If the result is within the tolerance of the target CAD system, then the process continues to step 539, which is described below. Otherwise, the process continues to step 536, where the target feature is adjusted. For instance, if it is detected that two lines do not meet in the target CAD object, one or both of the two lines can be extended towards the other in an attempt to create an intersection between the two lines. In step 537, the tolerances can again be tested, as is described above. However, if the test fails, then a failure notification is returned to the data exchange process in step 538.

If the test succeed, in step 537, then in step 539 undo information can be persistently stored in memory so that, if needed, the creation process can be undone in practice, what is saved in the undo information is a synchronization point or marker for the source CAD model, as well as the corresponding operations for the target CAD model.

For example, assume a particular source CAD model has three features. When exchanging the source CAD model to the target CAD model, the first two features are successfully transferred, but the third fails. It is possible that the third feature exchange was not, in fact, a failure; rather the first or second feature exchange caused the third feature exchange to fail. In such a circumstance, when adjusting the particular target CAD feature (itself) does not successfully reproduce the source CAD feature, it is possible to back-out the second feature and then repeat the second feature exchange with a new technique. If adjusting the second feature exchange does not achieve a successful operation for the third feature exchange, then the first feature can be backed-out with the undo information.

In step 540, a "success" signal is returned to the main CAD data exchange process. While not an explicit step in the failure detection process, note 541 shows that a subsequent operation may identify a failure from a previous operation. In such an instance, the undo information saved in step 539 can be used to undo the previous operation—and any subsequent operations to the previous operation. The failure detection process ends after steps 548 and 551.

Referring to the system shown in FIG. 4 and the method shown in FIG. 5A, a typical data flow is as follows. The source CAD system 401 comprises PRO/Engineer CAD software. An engineer working with the target CAD system 403, uses Catia CAD software. The engineer would like to take a CAD model designed with the PRO/Engineer software and create a Catia CAD model. A CAD data exchange process is initialized by the by the engineer.

Returning to the data flow, first, a feature list or feature tree in the source CAD system 401 is examined by the intermediary system 400. The intermediary system can be a standalone system, or it can be a plug-in on either (or both) the source CAD system 401 and/or the target CAD system 403.

An extraction process 406 begins by testing the API of the source CAD system 401 for functions that translate individual features to the target CAD system 403. If no API's exist in the source CAD system 401. In an iterative manner, the process continues after the API technique 408 so that the pattern recognition technique 4.09 (optional for extraction), the user emulation technique 410, and the boundary representation technique 411 are each used (only if the preceding technique failed) to create the CAD model for the target CAD system 403.

Once the source CAD data model has been extracted, then the creation process 407 begins. The creation process tests the API of the target CAD system 403 for functions that translate the individual features from the extraction process 406. In a similar, iterative manner, the process continues from the API technique 408, to the pattern matching technique 409, the user emulation technique 410, and finally to the boundary representation technique 411. Again, each technique being implemented if the previous technique failed, or, in some instances, in combination with a previous technique. For example, the pattern matching technique 409 can implement operations from the API technique.408 or user emulation technique 410, which will be apparent from the discussion below.

According to one embodiment, the database 402 stores data structures that hold patterns of match data for the pattern matching technique 409. The database can also store user interface data, such as graphical user interface mappings of a number of CAD systems. Moreover, the database can comprise various brep techniques that are most likely to succeed in a particular target CAD system 403.

In another embodiment, a bridge data structure 402' is created that can temporarily or persistently hold the CAD model for the target CAD system 403, as well as rollback and/or undo logs for backing out particular features or unsuccessful operations. In still another embodiment, the bridge data structure 402' can be a universal file format that is itself converted by the target CAD system 403 to a native format. Such a universal file format has the advantage of removing the extraction stage 406 in subsequent CAD data exchange processes (the extraction stage 406 does need to be performed at least once)—leaving only the creation stage 407 operations when more than one type of target CAD system 403 will be using the CAD model taken from the source CAD system 401.

Pattern Matching

Figure 6:
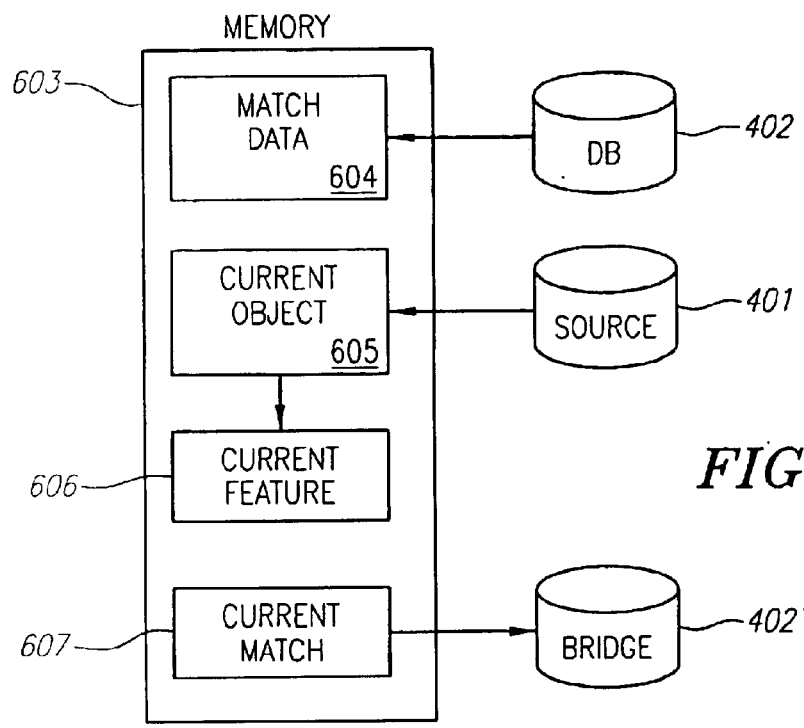
FIGS. 6–8 are diagrams corresponding to feature pattern matching. In particular.

Turning to FIG. 6, it depicts an operational overview of a pattern matching technique according to an embodiment of the invention. A volatile memory region 603 of a computer system holds portions of data from a persistent memory associated with, for instance database 402 and/or source CAD system 401, which can partially reside on one or more persistent magnetic or optical storage devices.

The volatile memory region 603 comprises four sections of memory. A match data region 604 temporarily caches static match data that is part of the system knowledge base. The match data is a subset of the knowledge base that is a region of interest, or of higher statistical probability for finding a known pattern. A current object region 605 temporarily caches one or more portions of a feature list from a source CAD system 401—this cache generally represents a set of data (or operations) that is sufficiently proportioned so that it is large enough to hold the largest source operation pattern.

Regions 604 and 605 are used primarily to reduce I/O and associated disk access latencies. The regions can be of variable. size, and, according to one embodiment, the memory 603 can further include a hash or index to expedite searches in larger record sets, or at least record sets that are beyond the bounds of the data stored in memory 603.

A current feature region 606 is smaller than the match data region 601. The current feature region 606 holds the source operation, drawn from the current object region 605 that is the basis of a query of the match data region 601.

The current match region 607 temporarily stores match data records, i.e., information from the records of the knowledge base 402 that indicate how the target CAD system is to construct the target CAD model—or the target feature. The current match region 607 can be small, but if it is small, then the region should be frequently written to a persistent memory region and then flushed. Of course, if the region is large, the same is true, but the frequency could be decreased.

Although optional, a bridge structure 402' is shown in FIG. 6. The bridge structure 402' can be universal data type or product representation—that is, an intermediate data type that is not, strictly speaking, the target data type. Thus, the bridge structure 402' can include additional information concerning the source CAD model, the target CAD model, and extraction and creation information that can be used for a lossless, two-way data exchange.

Figure 7:
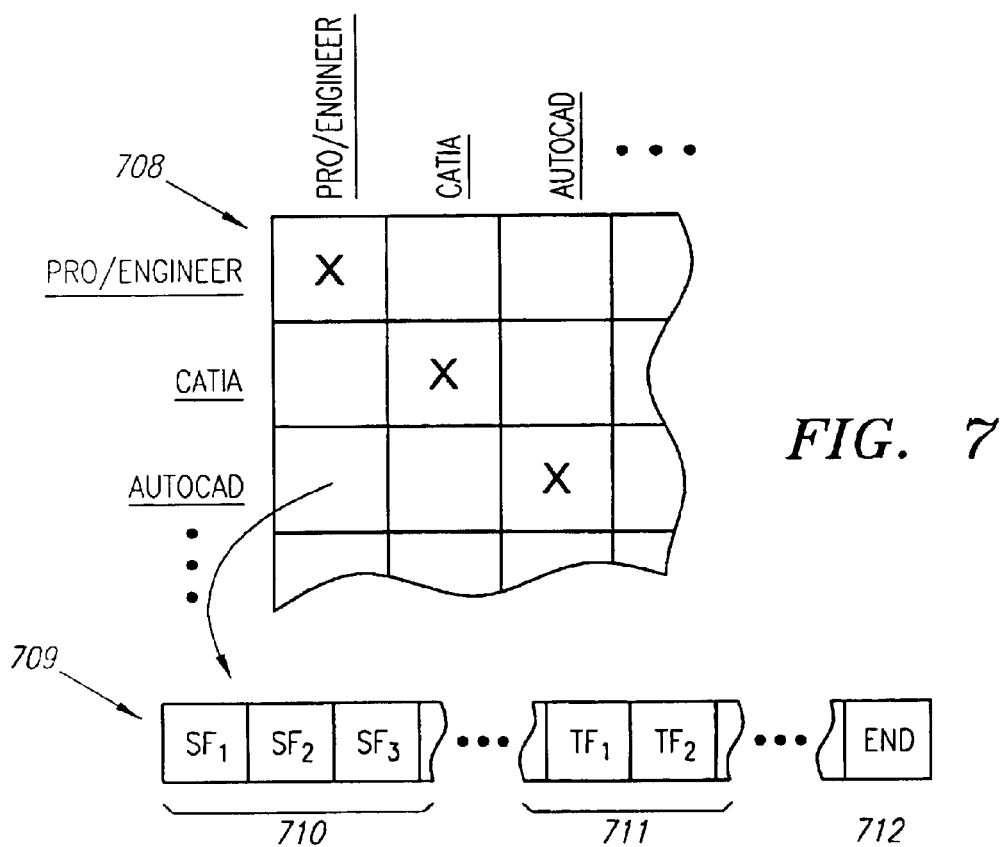

FIG. 7 depicts exemplary data structures for the knowledge base embodied in database 402. According to one embodiment, the data structure comprises a conversion table 708 having a source CAD system type and a target CAD system type. Matching the source and target CAD system types, a computer executing the steps of the invention can access a pointer to additional records or data structures that correspond to the particular CAD data exchange desired. While X's are shown for conversions of similar CAD types, the methods of the invention are equally applicable to conversions of CAD models of similar types, but having different versions. Thus, converting a CAD model from a ProEngineer Version 2000i2 to a ProEngineer Version 2000i, i.e., a backward conversion, is possible, as is a forward conversion (2000i to 2000i2). Pointers to match data records for the various version numbers can be included in the structure too.

According to another embodiment, a conversion table 708 is not necessary. For instance, the CAD data exchange software is typically embodied in a plug-in to a third-party CAD system. The plug-in can be conversion specific, meaning that the plug in only converts files of type A to files of type B (and vice versa). In such an instance, the conversion table 708 information is already known, thus the table 708 is not necessary.

In an aspect of the pattern matching technique, match data records 709 are used to effectuate the pattern (or even the function) matching process. The match data records 709 include two areas. The first area 710 stores source function or operation information. The, source function information corresponds to one or more operations or geometric structures in the source CAD system. The second area 711 stores target function information or geometric structures for the target CAD system—for instance, a pointer to a function that does the desired action. The target function information corresponds to one or more operations in the target CAD system—for instance, the target function information can include a function or pointer to a function for the API technique 408. An end of file area 712 can also be included so that match data records 709 are easily identifiable from one another, as it is possible that the records have a variable length. However, if fixed length match data records 709 are used, then the end of file area 712 is unnecessary.

Additional data structures can also be included. For instance, as was mentioned above with reference to FIG. 6, the match data records 709 can be broken into various hash buckets by using known hashing techniques, or a B-tree or other type of indexing structure can be used to expedite search operations. Moreover, it can be efficient to sort the match data records 709 prior to run-time or once the records have been updated. If the records are sorted then regions of memory with a high locality of reference (meaning that if a memory address X is called, then memory address Y is likely to be called too) can be grouped together, thereby reducing I/O and read latencies.

Figure 8:
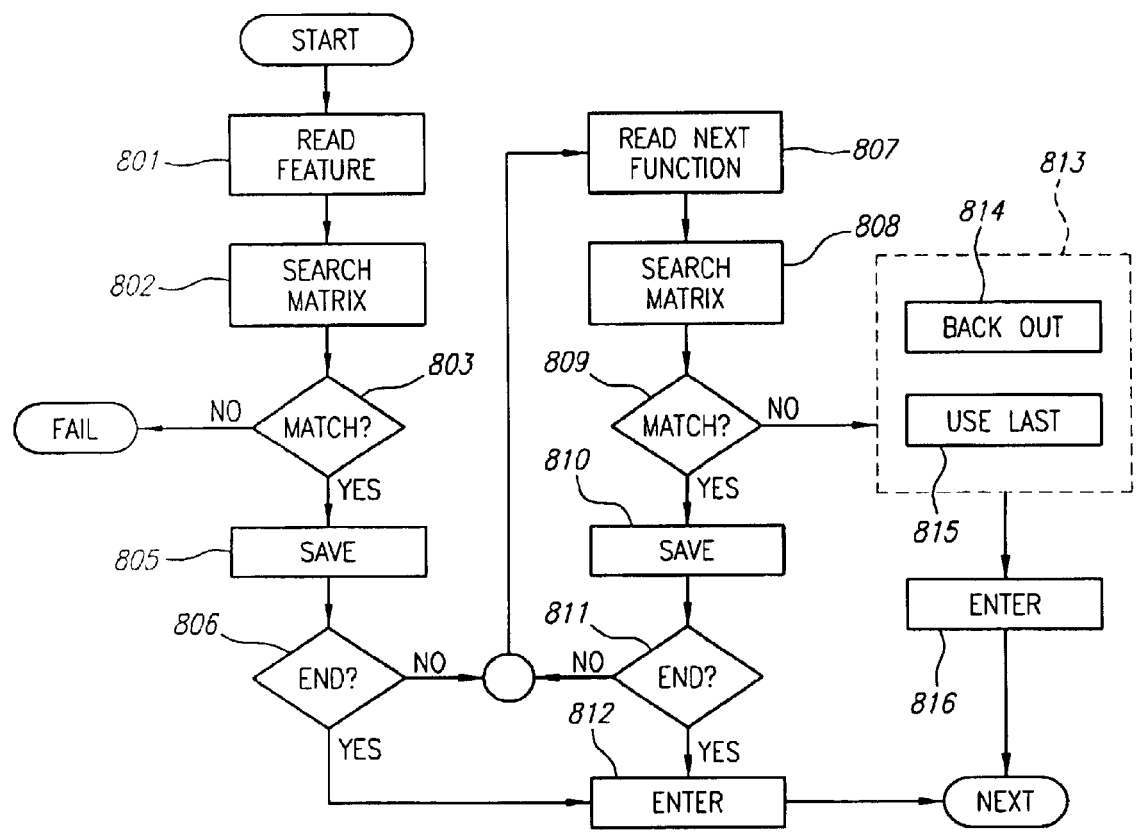

FIG. 8 is a flowchart detailing a method for pattern matching as applied to CAD data exchange. It is convenient, but not necessary, to review FIG. 8 with reference to FIGS.

6 and 7. For purposes of this explanation, it will be assumed that the relevant portions of the source CAD model 401 and the knowledge base 402 have been read into memory 603.

In step 801, a current feature from the source feature list is read and loaded into a the current feature region 606. In step 802, the data in the current feature region 606 is compared against source functions 710 in the match data region 601 by searching the region 606 for a matching data record. In step 803, if a match was found, then the process continues to step 805, otherwise a fail signal is returned to the main CAD data exchange algorithm (e.g. see FIG. 5).

In step 805, information corresponding to the current match data record 709 is saved in the current match region 607. The information can be current match record 709 itself, a pointer the current match record 709 in the knowledge base 402 or match data region 601, the target functions 711, or the target functions 711 translated with any supporting data (e.g., parameters for the target CAD system, and/or additional information concerning the extraction or creation process).

In step 806, a test is performed to ensure that there are no additional functions in the source feature that need to be exchanged. If additional functions need to be processed, then the method continues to step 807. Otherwise, in step 812 the current match record 607 can be persistently saved (if not already) and the next function corresponding to the feature can be loaded in step 807 such that the search (808) and match (809) steps can be performed.

In step 809, it is possible the additional function(s) added to the search created an incompatible match. In step 813, this scenario is handled. According to one embodiment, any changes made or added to the target feature list are backed-out on feature by feature basis (step 814). One reason this process may be implemented is that a subsequent attempt to handle the failed operation(s) may more efficiently model a series of operations (e.g., an entire feature) rather than a single operation. In another embodiment, the last saved match data record is used as the basis for the target feature list (step 815), and the remaining functions can be exchanged with the target CAD system via an alternative method. In step 816, the match data record information is entered for the target CAD model.

Returning to step 809, if a match is found, then in step 810 information corresponding to the match data record 709 is saved. If there are more operations in the source CAD model at step 811, then processing returns to step 807. Otherwise, the saved target function list, which can comprise multiple sets of information corresponding to target functions 711, is entered into the target CAD model in step 812.

It is worth noting that while the pattern matching process described above was defined with reference to a particular feature, which is the preferred embodiment, it is possible to perform the pattern matching with respect to individual functions without regard to their overall relationship to a particular feature.

According to one embodiment, after a particular feature is created using the pattern matching technique, then a physical and/or geometric property analysis (as is discussed above) is performed on the target feature and the properties are compared against physical/geometric properties of the source feature. If the properties do not match, then the parameters of the target feature list can be adjusted until the properties are within an acceptable tolerance.

User Emulation

Figure 9A:
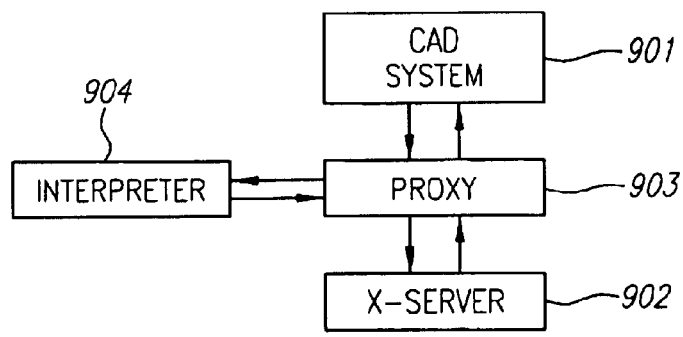
FIGS. 9A–C and 10A–D are diagrams corresponding to user emulation. In particular.
Figure 9B:
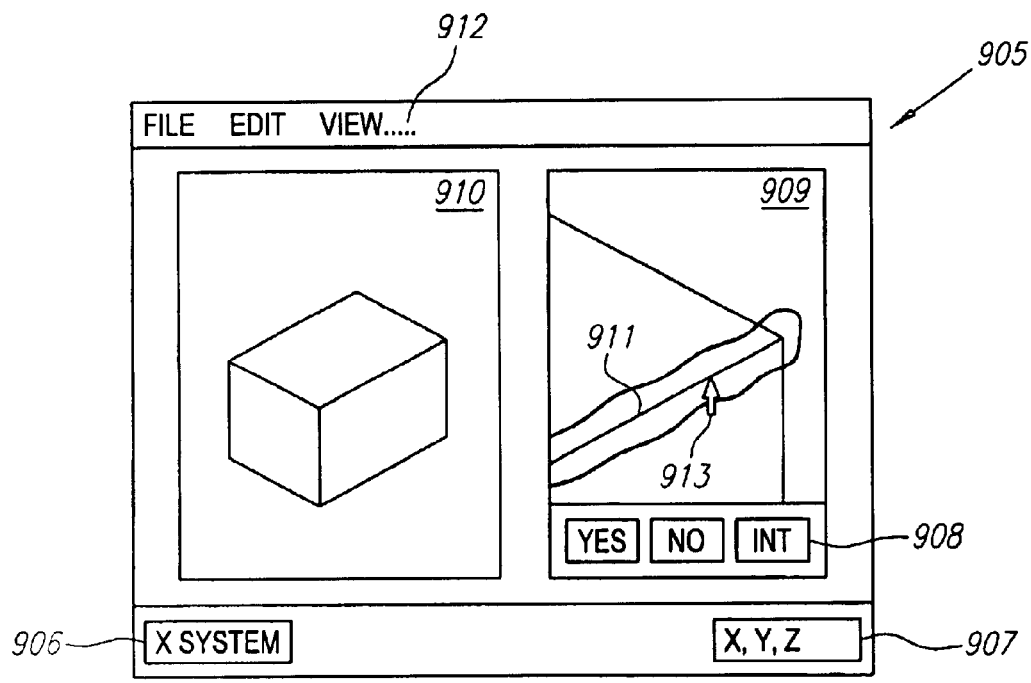
Figure 9C:
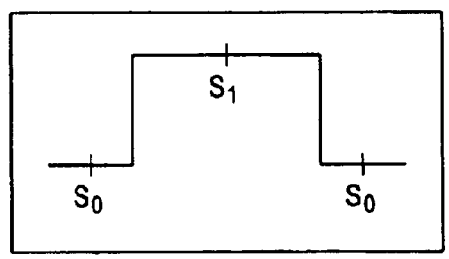

FIGS. 9A–C depict aspects of user emulation, which is a fallback or alternative technique used to perform the extraction and creation processes. According to one embodiment, the user emulation techniques are used to directly exchange data from the source CAD system to the target CAD system. Alternatively, the user emulation techniques can be used to exchange data from the source CAD system to the target CAD system though an intermediate file, such as the bridge data structure. In still another embodiment, the user emulation techniques are used to gather information on either the source CAD model or the target CAD model.

For instance, the user emulation techniques described below can be used to collect attributes or callout information corresponding to a source or target feature, to perform geometric or physical property analyses, or to select a particular edge or face on the source or target CAD model. In still other embodiment, the user emulation techniques can be used to automate a process with a known user interface behavior.

Turning to FIG. 9A, it is an architectural overview of an embodiment of the user emulation techniques. The figure is useful in understanding how the different software modules of a programmed computer interact.

CAD system software 901 includes a user interface. The user interface typically interacts with a user through a pointing device, such as a mouse, or keyboard controls. For purposes of this explanation, the mouse and keyboard controls will be called "interface inputs". In fact, however, the user interface does not directly interact with the interface inputs. In practice, interface inputs are passed through a device driver (not shown) and presented on a computer monitor (not shown). At the same time, information corresponding to the interface inputs are passed through, for instance, an X-server 902 to the CAD system 901. The user interface of the CAD system 901 in turn can respond to the interface inputs by sending data or commands back through the X-server 902, which are then output to the computer monitor.

It is noted that an X-server is only an exemplary graphical windowing module. Under certain operating systems, the role of the X-server is performed by other graphic images servers or modules. These modules can include, for instance, the USER.EXE and GDI.EXE executables in Microsoft Windows NT. In other environments additional executed or interpreted modules, such as interfaces created in Java Script or using various Java classes, could perform a similar functionality for the application or operating environment.

For example, a user may move a cursor (with a mouse) from position (x1, y1) to (x2, y2) and then performs a mouse click. The mouse sends the interface inputs to a device driver, which translates the movement into electrical signals. The interface inputs are sent to the X-server 902, which controls a bitmap display for the monitor. Electrical signals are also sent to the CAD system 901. The CAD system 901 receives the interface inputs and determines how the CAD software should respond (or change) to the interface inputs. The response can include changing the color of a particular menu item, presenting menu pull-down list, or selecting a feature of a particular object. Once the CAD system 901 determines how the display should change, the CAD software makes the corresponding state change internally and then sends additional information back to the X-server 902 so that the computer display can be changed appropriately.

According to the invention, the user interface does not interact with the X-server 902 directly. Instead, the user interface interacts with one or more software modules, at least one of which is emulating a user. In an embodiment of the invention, a proxy 903 acts as a buffer between the CAD system 901 (and its user interface) and the X-server 902. Signals passing through the proxy 903 are passed off to an interpreter 904, which examines the signals and emulates a user response. The emulated user response can be sent back through the proxy 903 to the user interface or to the X-server 902. (It is worth noting that the proxy 903 and the interpreter 904 can be resident in a single software module, for instance a plug-in that is coupled through the CAD system 901.)

In an alternative embodiment, data and control signals between X-server 902 and the CAD system 901 can be captured by a plug-in to the CAD software. In responding to the captured signals, the plug-in can enter a state that is essentially a time delay. A second, sub-thread can then be spawned by the plug-in that processes the captured signals. Once the plug-in has processed the signals, it can store state information (in reserved memory associated with the plug-in) corresponding to the CAD system and signal the plug-in to terminate the wait state.

Meanwhile, the CAD system returns to normal processing under the assumption that the plug-in has terminated. The next time the signals are captured by the plug-in, the plug-in can again instruct the CAD system to invoke the plug-in and then resume processing in the sub-thread—picking up the process where it left off. While this technique may not be thread safe, it is a useful method for executing two processes that are, in a normal operating environment, mutually exclusive.

According to one embodiment, before terminating the plug-in, the sub-thread initialized a timer. The timer can be used to detect when an external processing error occurs. If the timer expires before processing the state information by the sub-thread is resumed, then an error message can be returned so that the user emulation process can be canceled or backed-out.

According to an embodiment, the underlying.CAD system, C library implementation, or platform does not allow safe cross-thread calls. To work around this prohibition, when the sub-thread needs to directly call the CAD system API, the sub-thread uses inter-process communication, remote procedure calls, or cross-thread messaging techniques to pass a request to the plug-in to perform the call on the sub-thread's behalf.

FIG. 9B is a screen shot 905 detailing aspects of a selecting an object, which is one useful process to which the user emulation techniques can be applied. In an environment, the screen includes a tool bar 912, which has text based menu options, a major view 910 of the object (here a cube), and a zoomed view 909 of a portion of the object. The zoomed view 909 further includes a button bar 908, which has mouse selectable options that are typically used for specifying to the CAD system whether a particular feature of the object has been selected. Also shown in the screen shot 905 is a status indicator 906 and a coordinate indicator 907, the coordinate indicator 907 showing a present position of the cursor 913. A graphic element, here an edge 911, of the object is shown highlighted. (As used herein, the term "graphic element" refers to a line, edge, face, surface, or other graphical design feature of the CAD object—usually in two- or three-dimensional form, that is presented for a computer display)

FIG. 9C is a diagram of an exemplary signal from the X-server 902. In this instance, the signal can be a color indicator for a particular graphical element shown in the. windowing system. According to an embodiment, an act of selecting a graphical element on the object involves monitoring one or more signals from the X-server 902 for a state transition in a color indictor associated with one of the buttons in the button bar 908, or the status indicator 906. Detecting the state transition of an indicator can implicitly indicate that a user emulation process did not fail.

For instance, the X-window text in the status indicator 906 may change colors depending on whether the system is waiting for a user response or processing a previous response. Another option is to scan text for dialogue boxes or pop-up windows for words indicative of a failure or success of a previous operation.

FIGS. 10A–D are flowcharts detailing steps for the user emulation techniques. The user emulation techniques are typically performed by the interpreter 904 in combination with other elements of a computer system.

Figure 10A:
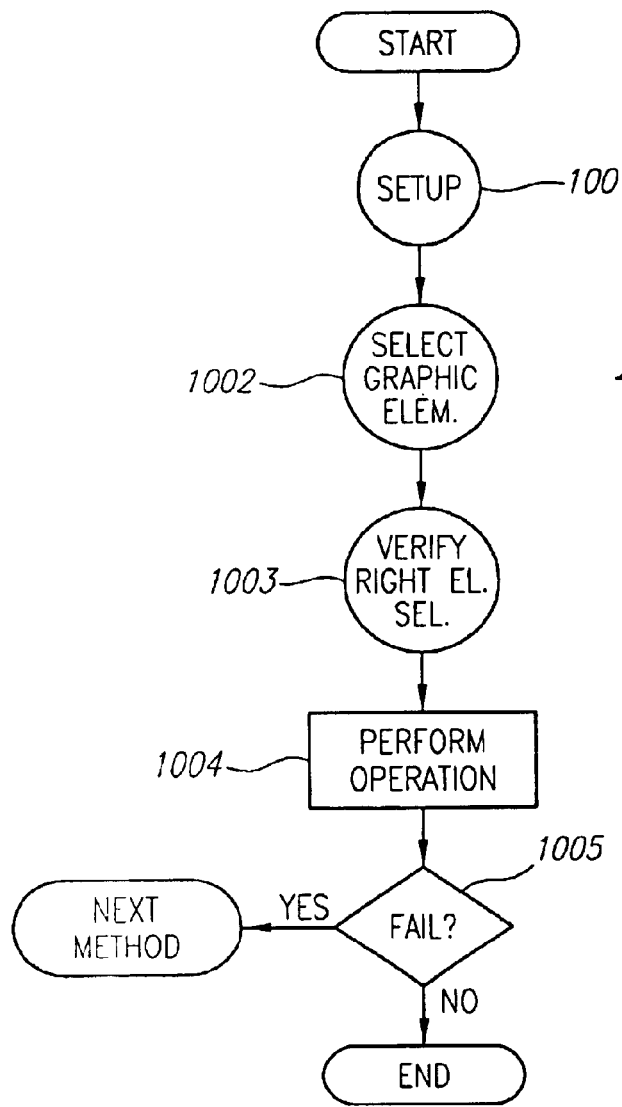

Turning first to FIG. 10A, it depicts the primary steps for user emulation. In step 1001, setup operations are performed so that the interpreter 904 can be calibrated to the windowing system. In step 1002, a graphic element shown in windowing system is selected.

In step 1003, a test is performed to verify that the correct (or desired) graphic element is selected. For instances, selecting and verifying the graphic element can involve stepping through a feature list in a CAD model and monitoring a signal from the X-server 902. Alternatively, emulated mouse movements and clicks can be sent to the X-server 902 and the resulting status signals returned to the CAD system 901 can be monitored for state transitions or text strings.

Once the correct graphic element is selected, then an operation is performed on the graphic element in step 1004. The. operation can be performing a property analysis, reading attributes corresponding to the graphic element, hiding or suppressing the graphic element, initiating an export command (e.g. creating a brep), or modifying attributes corresponding to the graphic element. In step 1005, a test is performed to determine whether the operation failed. If the operation failed, then the next CAD data exchange method is attempted, otherwise the exchange method can be considered successful.

Figure 10B:
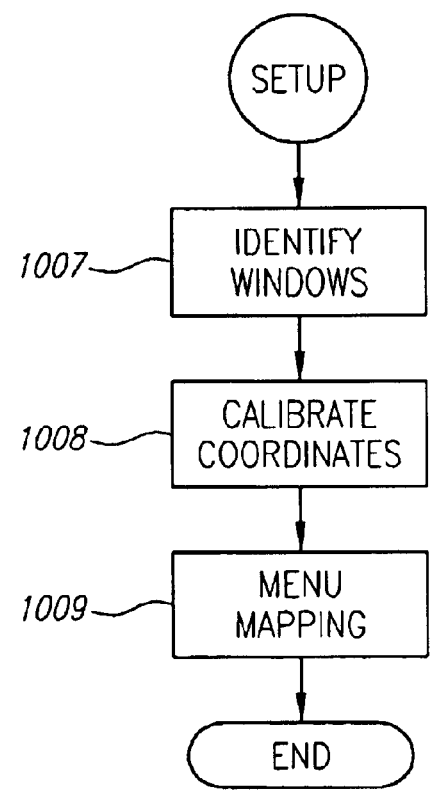

FIG. 10B is a flowchart depicting steps for performing the setup operations. In step 1007, the windows shown in the display device are identified. Window identification is based on any or all of the following, depending on the specific CAD system involved: (1) the window hierarchy (e.g., the number of child windows, the position of the various windows in the window list); (2) any text string displayed in the windows; and/or (3) the geometry of the windows (e.g., their width, height, ratio of width to height, position on the screen). The windows can be stored in memory with identifiers selected by the CAD data exchange software, or they can be stored with identifiers corresponding to text associated with the window (e.g., a title or header). Next, in step 1008, signals corresponding to movements of the cursor (e.g. 913) are calibrated to the coordinates of the windowing system (e.g. 907). The calibration is saved in memory so that adjustments or translations can be made to signals generated by the interpreter so that the signals are tuned (e.g. scaled) to the particular windowing environment and pointing device settings.

In step 1009, a menu mapping is performed. Generally, the menu mapping involves reading the text of the main tool bar 912 options, sending a mouse click to each option and further mapping the sub-options. The results of the mapping are also stored in memory so that they can be aligned with future operations that are to be performed, such as if user emulation is used as part of the pattern matching techniques.

The menu mapping can also be used to verify the (national) language or version of the CAD software.

Figure 10C:
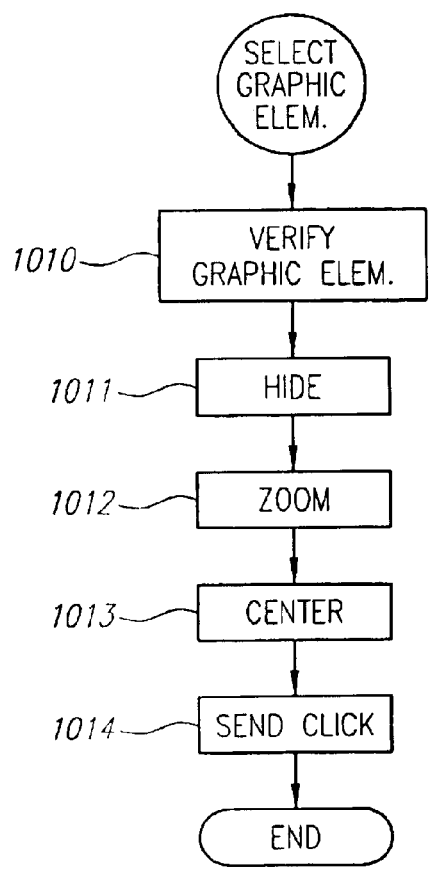

FIG. 10C is a flowchart depicting steps for selecting a graphic element. The steps are particularly related to selecting a feature or aspect of an object presented in a window, rather than an option from main tool bar 912 or one of its sub-options.

In step 1010, a test is performed to verify that the graphic element is visible in the target window. If the graphic element is not in the target window, then the window positioning or vantage point can be adjusted, for instance by using the main tool bar 912. In step 1011, one or more features other than the desired feature (e.g. those features directly adjacent to or near the desired feature) are hidden or suppressed. In an alternative embodiment, the one or more features are deleted, but only where they can be recovered later. Next, in step 1012, a region of the target window is zoomed out (making the object smaller), and in step 1013, the window is centered about the target graphic element. In step 1014, a mouse click is sent to the center of the target window.

Figure 10D:
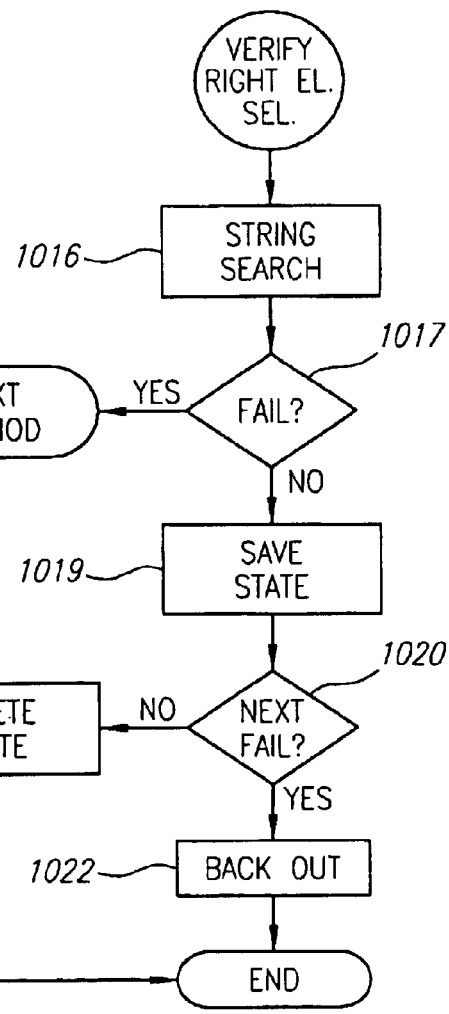

Turning to FIG. 10D, it is a flowchart depicting a technique for verifying that the right element is selected. In step 1016, a return string or state indicator from the X-server 902 is checked to verify that the correct graphic element was selected. According to one embodiment, if the correct graphic element, or any selection was not detected, then the process continues to step 1012 (or step 1002) so that the target window can be re-centered about another point and/or the zoom factor can be decreased (making the object larger).

However, as is depicted in step 1017, if a failure is detected, then user emulation is canceled and processing continues to the next CAD data exchange technique. If a failure is not detected, then state information corresponding to the CAD object prior to any changes made by the user emulation process is persistently saved in step 1019.

Step 1020 shows a test for a failure of a subsequent operation, for instance in an operation that occurred outside of a user emulation technique—an API, a pattern matching, a later user emulation, or a brep process—when handling the CAD data object. If the subsequent operation failed, then it is possible that the user emulation from the previous operation was in fact a failure even though no immediate failure was detected (e.g. from a property analysis). Thus, in step 1022, the state information stored in step 1019 is backed out (e.g. a rollback process) from the CAD data model. If the subsequent operation did not fail, then in step 1021 the state information is deleted.

Edge Selection

Part of the CAD data exchange process can involve performing operations that require identification of some part or feature of a defined CAD model. To this end, the edge selection techniques described below provide a new and useful tool that can be used when performing such operations—the techniques are used for the purpose of correlating source edges to target edges in a plurality of computer aided design systems. For instance, the operations can include a round or chamfer operation on a target CAD model, or selecting a face of an object. The process can be a stand-alone process, the process can integrate steps from the user emulation process (described above), or the process can be integrated into the user emulation process. Furthermore, it is noted that in the accompanying figures and description, abstractions of lines and shapes are used, as they might appear to they eye, even though what is actually operated on and used in the techniques are data representations of lines and shapes.

Figure 11A:
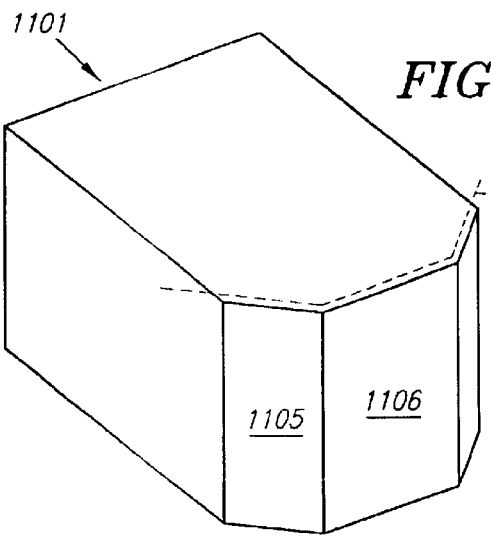
FIGS. 11A–D and 12–17 depict edge selection techniques. In particular.
Figure 11B:
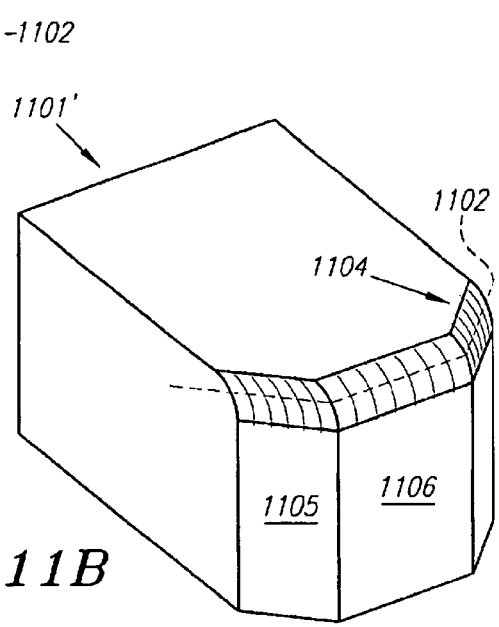

FIGS. 11A–D illustrate the current problem. FIG. 11A depicts a 3-dimensional object 1101 in a source CAD system. The object has a somewhat rounded side that is represented by four faces (only face 1105 and 1106 are called out). An edge 1102 represents a curve formed by the four faces. A round operation is specified in the source CAD model, the operation being performed on the edge 1102. Referring to FIG. 11B, when the round operation is performed, a rounded edge 1104 is formed where the edge 1102 once existed. The object 1101 is now shown as object 1101'.

Figure 11C:
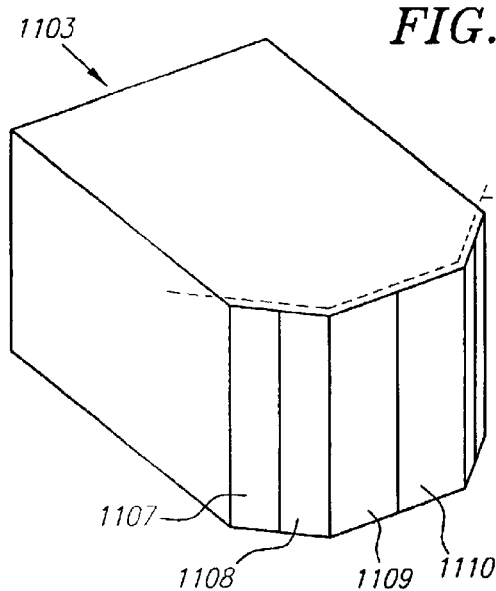
Figure 11D:
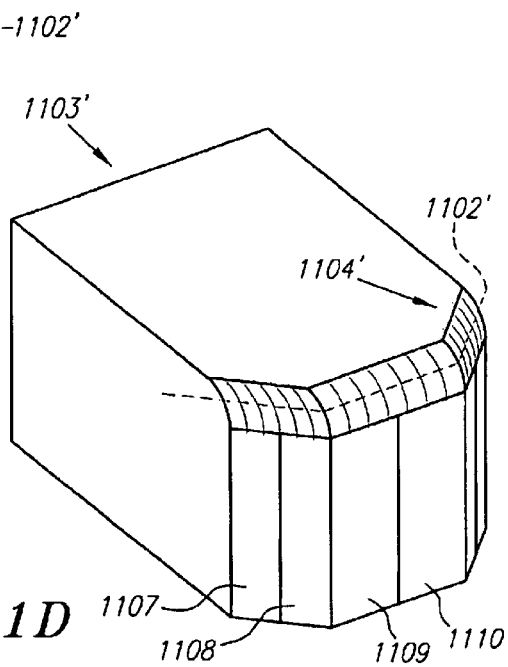

As is mentioned above, an underlying object of the CAD data exchange techniques is that the design intent from the source CAD model is preserved in the target CAD model. Accordingly, in some instances, finer granularity representations of source CAD model are often found in target CAD models, while in other circumstances, the opposite relationship exists. FIGS. 11C–D show such a finer granularity representation of the source CAD model as embodied in the target CAD system. For instance, in object 1103, the four faces that comprise edge 1102 in object 1101, now consist of eight faces, which include faces 1107, 1108, 1109 and 1110, and now make edge 1102'. What is desired is to correlate the edge 1102 with the edge 1102' so that the feature 1104 can be created in the target CAD system as feature 1104'.

Figure 12:
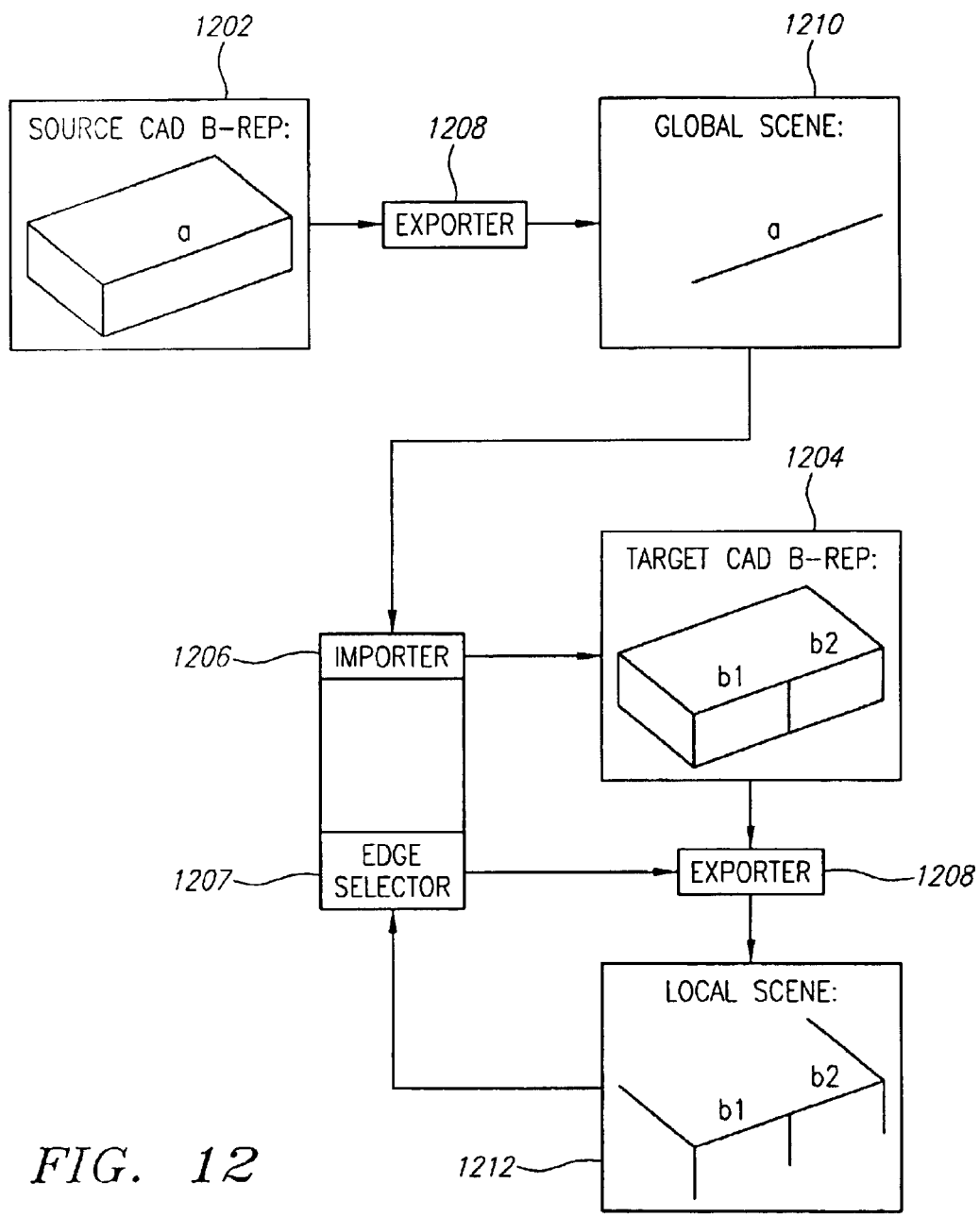

FIG. 12 depicts an operational overview of the edge selection algorithm. An object (e.g., a boundary representation of a block) exists in the source CAD system 1202, the object having an edge "a". Edge "a" is exported to a global scene 1210 for the data exchange product by an exporter module 1208. Once the edge "a" has been identified in the global scene 1210, the importer module 1206 must now identify the corresponding edge in the target CAD system 1204. A local scene 1212 is then exported from the target CAD system, the local scene representing a plurality of candidate "edges" that may match edge "a". It is noted here that the local scene 1212 is exported in an incremental manner. While:it is possible that the entire local scene 1212 may be exported at once, generally, this is not the case, which is noted by the circular data flow noted in FIG. 12.

Once the local scene 1212 (or a portion thereof) is exported, then the edge selector module 1207 begins the correlation process. Edges in the target CAD system 1204 that are unnecessary are removed from candidacy, while a mapping is maintained of the others, the mapping ideally representing an n:m, where n is greater than or equal to m, correspondence. between the target CAD system 1204 edges and the source CAD system 1202 edges. Since the mapping is maintained, subsequent operations on edge "a" can be identified as applying to edges "b1" and "b2". Following are multiple techniques that can be used independently or in combination for selecting an edge.

Edge Overlap Algorithm

The underlying premise of the edge overlap algorithm is that two edges (i.e., from a source CAD model and a target CAD model—the global and local scene) overlap if their intersection is topologically one dimensional ("1-D"). If the two edges overlap, then they lie on the same geometric carrier.

In one embodiment, the geometry of an edge is represented as a non-uniform rational B-spline ("NURBS"). Making a NURBS representation of the geometry of the edge gives each edge a start-point and an end-point. If the edge is closed (i.e., a circle) then the start-point and end-point coincide. While start-points and end-points are used according to one embodiment, it is also acceptable to use start- and end-vertices. Other embodiments of the invention are envisioned, thus another representation of an edge can also be discrete linear segments with corresponding Cartesian coordinates..

Figure 13:
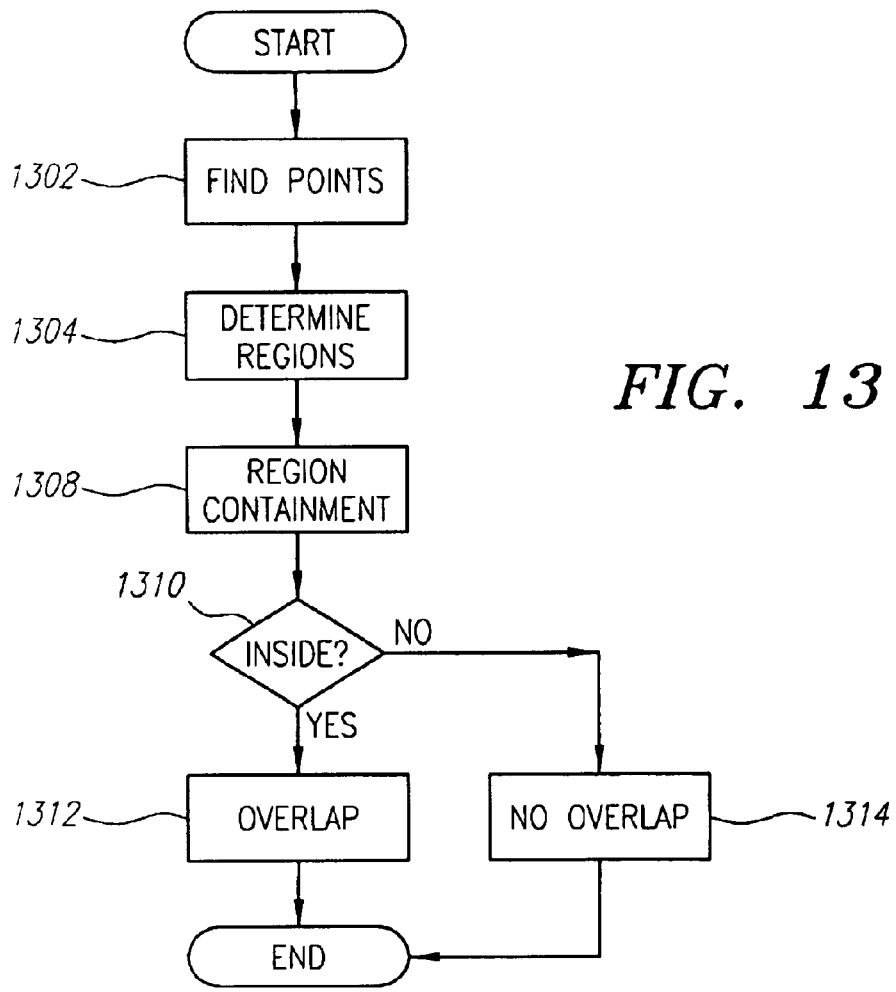

Turning to FIG. 13, it is a flowchart depicting the edge overlap algorithm. In step 1302, the start- and end-points of the NURBS representing each edge are extracted from the NURBS.

In step 1304, regions are determined in, for instance, the source edge. The regions represent the number of times the source edge is divided if the target edge start- and end-points are mapped onto it. Thus, if a single point in the target edge is found in the source edge, then the source edge has two regions. However, if two points in the target edge are found in the source edge, then the source edge has three regions. It is useful in step 1304 to sort the extracted points—the regions of the source edge are between every consecutive pair of distinct (sorted) points.

Figure 14:
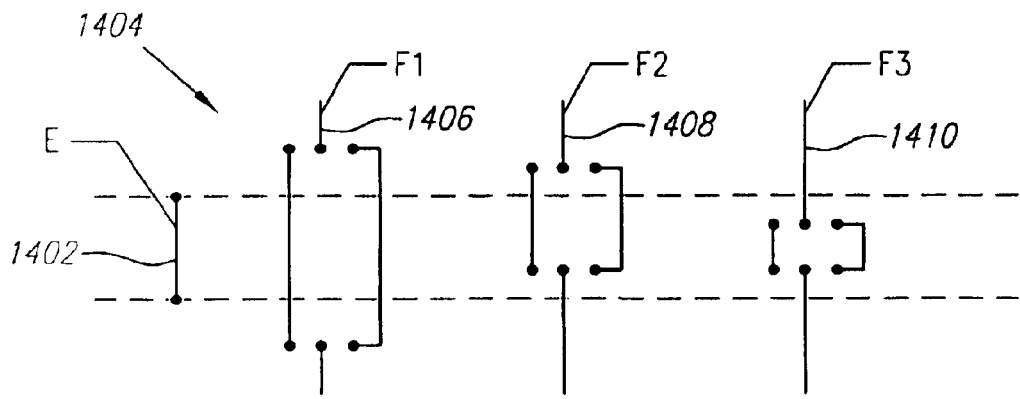

FIG. 14 illustrates an example of determining regions of a source edge. A source edge "E" (1402) and three candidates 1404 for target edges "F1" (1406), "F2" (1408), and "F3" (1410) are depicted. Determining the regions of source edge E vis-a-vis the various target edge candidates 1404: E has one region with respect to F1; E has two regions with respect to F2; and E has 3 regions with respect to F3. When identifying the regions, it is noted that the source edge always has at least one region but no more than three regions.

Returning to FIG. 13, in step 1308, a region containment operation is performed. The region containment algorithm, of which step 1308 is a part, assumes that the source edge and the target edge have the same geometric carrier. The region containment operation selects the midpoint of a region defined by the source edge. In step 1310, a test is performed to determine whether the selected midpoint is within the target edge. In step 1312, if the selected midpoint is within the target edge, then the source and target edges are said to overlap and the result is returned. If the midpoint is not within the target edge, then no overlap is assumed to exist, an appropriate response is returned in step 1314.

It is noted that the above process does not require laser-like precision. It is appreciated by the inventors that different CAD systems may represent a non-linear segment in different ways. It is not the objective of the CAD data exchange system to re-create source CAD models exactly the same way in a target CAD model—that is, with the same underlying know-how. Rather, it is the objective to create an acceptable target. CAD model that respects the know-how of the source and target CAD systems. Thus, tolerance in determining whether a particular point on the source edge or target edge lies in the other is designed into the analysis. Accordingly, mathematical or statistical analyses can be used to model such a tolerance, or the tolerance can be hard-coded into the CAD data exchange system.

Edge Containment Algorithm

While the granularity of the target CAD model is ideally the same or finer than the source CAD model, it is possible that the target CAD model represents a particular edge in a manner that is more efficient than the source CAD model. In such a circumstance it is useful to perform an edge containment algorithm (as opposed to the region containment operations) to verify that all of the regions -of the source edge are contained in the target edge. It is further noted that this process can be used to verify the overlap of two edges even though the target edge is represented in a finer granularity -than the source edge.

As was the case with the edge overlap example, the source and target edges can be utilized from the global and local scenes (depicted in FIG. 12). Depending on the verification desired (i.e., the target edge has more representative regions than the source edge or vice-versa), the input to the edge containment algorithm can be selected according to the desired output. Furthermore, the edge containment algorithm can be used in conjunction with the edge overlap algorithm, which is described above.

Here, for the purpose of explanation, it is assumed that the target edge has more representative regions than the source edge, as was the case above with reference to FIGS. 11A–D. Additionally, when a set of target edges overlap with a source edge "e", this set of target edges will be referred to as a "connected" set. Furthermore, a sequence of oriented edges, such that the end-point of each oriented edge is the starting point of its successor, will be referred to as a "chain".

Figure 15:
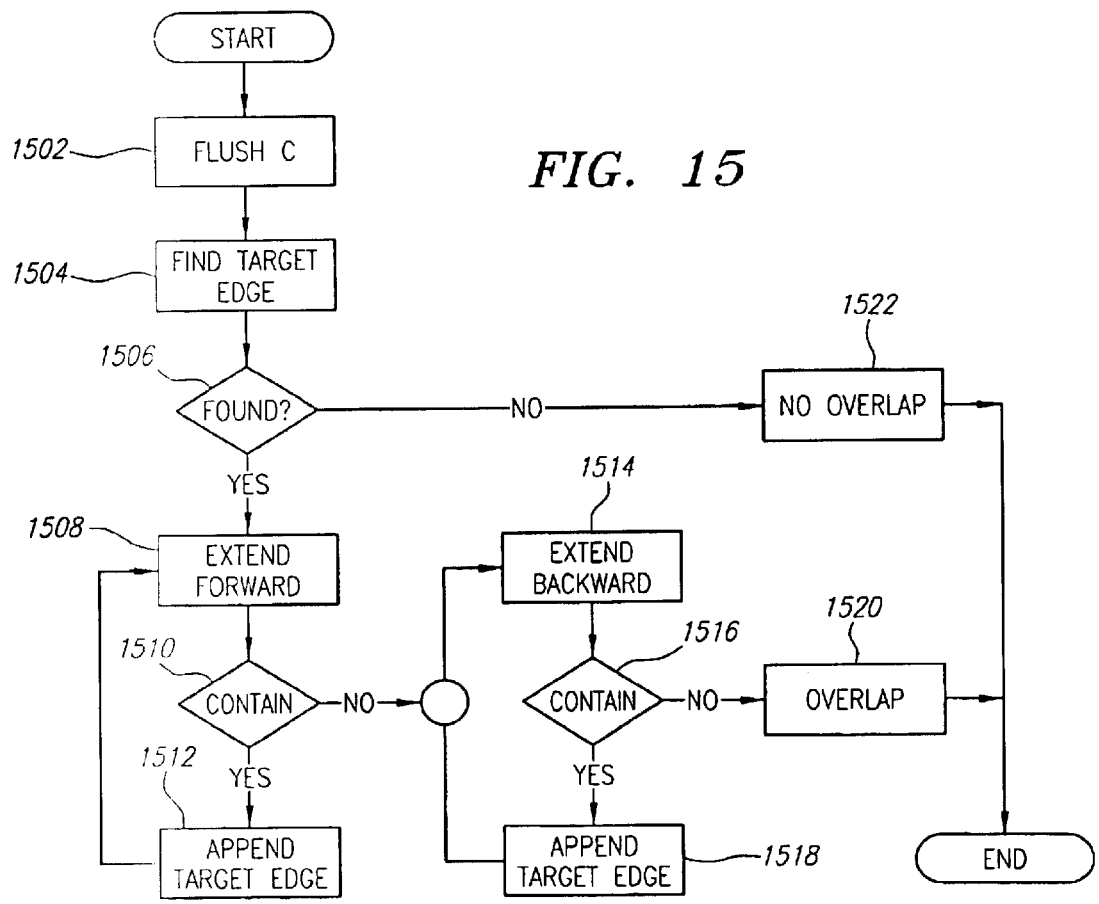
Figure 16:
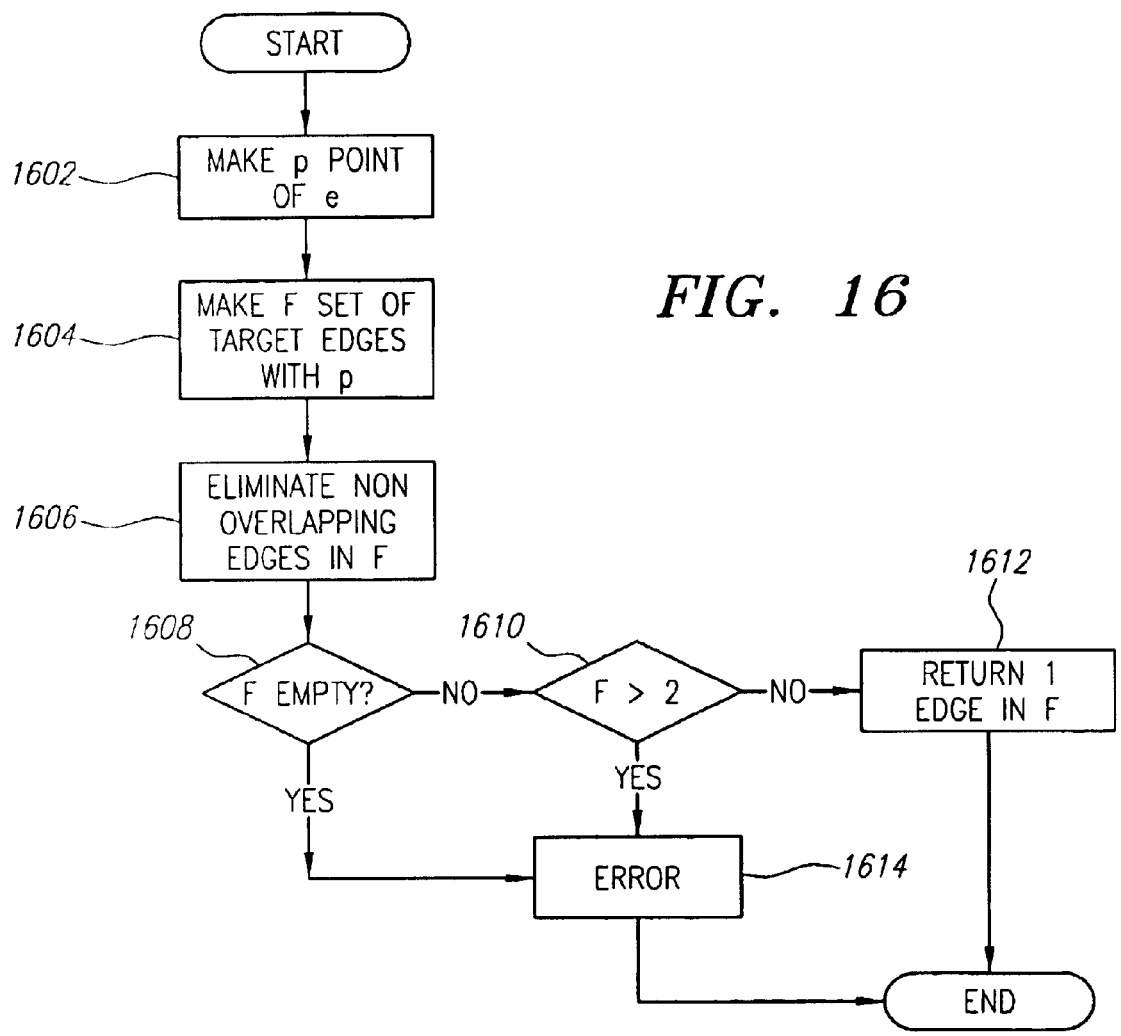

Turning to FIG. 15, it is a flowchart of the edge containment algorithm. In step 1502, a sequence of memory locations representative of a chain of target edges ("C") is flushed. In step 1504, a first target edge is located, preferably from the local scene, and added to the set "C". FIG. 16, which is described below, depicts an embodiment of one algorithm for finding the first target edge. According to another embodiment, the system searches for an edge within a given proximity of a source edge "e".

In step 1506, a test is performed to determine whether a target edge was found and whether the target edge overlaps the source edge "e". If no target edge was found, or the edges do not overlap, then the target edge is removed from candidacy as a matching edge in step 1522. Otherwise, in step 1508 the target edge is extended forward to encompass a next, connected edge. In step 1510, a test is performed to determine whether the newly extended edge is contained by the source edge "e". In step 1512, if the newly extended edge is contained by the source edge "e", then the next, connected edge (extended above) is appended to the target edge and saved in the chain of edges "C". The process repeats until the target edge can be extended forward no longer.

In step 1514, the same process that was described above with reference to steps 1508–1512 is performed, but here, the target edge is extended backward in steps 1514, 1516, and 1518. Moreover, if the extended edge is not contained by the source edge "e", then processing continues to step 1520.

It is noted that one embodiment of the edge extension process, which is depicted in steps 1508, 1510 and 1512, as well as steps 1514, 1516, and 1518, is described in below with reference to FIG. 17.

In step 1520, the chain of edges "C" is returned as the target edges that matches the source edge.

Finding an Initial Edge

Turning to FIG. 16, it depicts an embodiment of a computer implemented method for finding the initial edge for the edge containment algorithm. In step 1602, a point "p" is selected from the source edge "e". The "p" can be an interior point of "e", or it can be a start- or end-point. In step 1604, a set of edges "F" (e.g., from the local scene) is created that contains the point "p". (It is noted that the set of edges "F" may have already existed in the local scene, but additional members of the set "F" can be added at step 1604—since the creation of the local scene is an incremental process.)

In step 1606, non-overlapping edges in set "F" are removed from set "F". Generally, each edge in set "F" can be iteratively tested against the source edge "e" to verify that the two edges overlap.

In step 1608, a test is performed to determine whether the set "F" is empty. If the set "F" is empty, then an error has occurred, as is indicated in step 1614. If the set "F" is not empty, then in step 1610 a test is performed to determine whether the set "F" holds more than 2 target edges. If the set "F" holds more than two target edges, then an error has occurred, as is indicated in step 1614. If, however, the set "F" comprises one or two target edges, then one edge is returned for processing in step 1612. (The second edge can be processed if the returned edge does not sufficiently overlap the source edge "e".)

It is noted that step 1614 can involve one or more error correction schemes whereby the particular error correction scheme selected may have an effect on steps 1608, 1610, and/or 1612.

Those schemes can include selecting a new point "p", or selecting a second point "p'"—the second point "p'" being close to point "p".

It is noted that FIG. 16 can short circuit the remainder of steps depicted in FIG. 15 if, for instance, a single target edge is identified that completely contains (and is itself completely contained by) the source edge.

Chain Extension Algorithm

Figure 17:
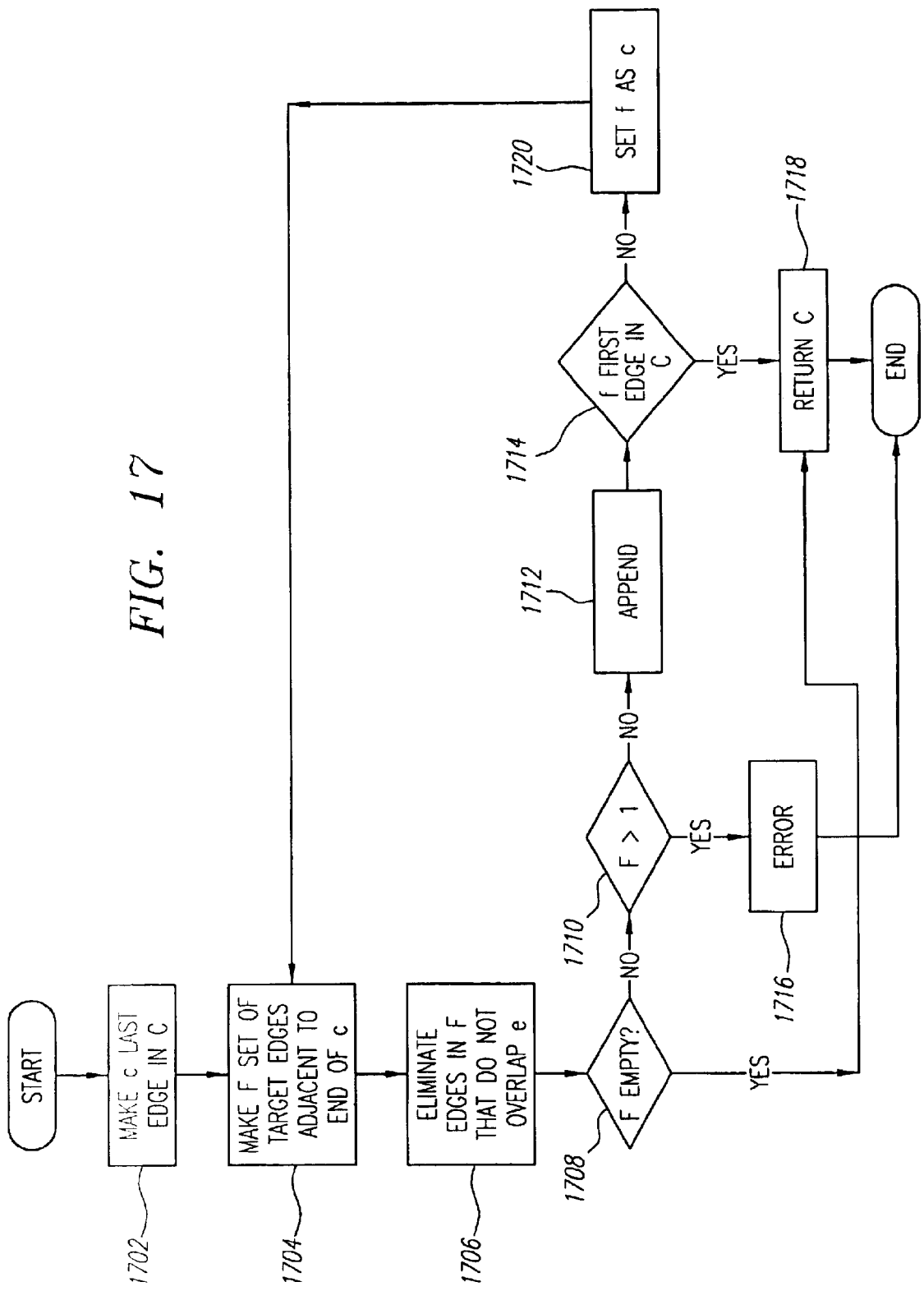

Turning to FIG. 17, it depicts a computer implemented process for extending a chain of edges ("C") representing the source edge "e" according to an embodiment of the invention. The method can be used as a substitute for the process described above with reference to FIG. 15 (steps 1508, 1510, and 1512, or steps 1514, 1516, and 1518), or an adjunct to the process. Moreover, the chain extension algorithm can be applied equally to the process of extending a chain of edges forward or backward.

In step 1702, a member of the set of edges, i.e., the chain. of edges "C", is made the last edge in the set. For purposes of explanation, this edge will be referred to as edge "c". In step 1704, a set of target edges adjacent to an end of "c" is identified. This set of adjacent edges will be referred to as set "F". In step 1706, edges in set "F" that do not overlap the source edge "e" are eliminated—in accordance with any of the overlap or containment processes described above.

In step 1708, a test is performed to determine whether the set "F" is empty. When "F" is empty, then the algorithm proceeds to step 1718. If the set "F" is not empty, then in step 1710 a test is performed to determine whether the set "F" includes more than one target edge. If step 1710 results in a response indicative a set of "F" that is greater than one, then an error has occurred and step 1716 is performed. Step 1716 can include returning a failure result, or indicating that a new edge "c" should be selected; or the existing edge "c" should be extended another direction.

However, if there is exactly one edge adjacent to target edge "c", then the one edge (edge "f") is appended to the set "C" in step 1712. In step 1714, edge "f" is tested to determine whether it is the first edge in the set C (i.e., there are no more adjacent edges that are not members of set "C"). If edge "f" is not the first edge in set "C", then in step 1720, edge "f" is set as edge "c", and the process continues to step 1704. Otherwise, in step 1718, set "C" is turned and the process is completed.

Finally, it is noted that it may be desired to repeat the above process in another direction—as the process described above was only with reference to a single direction of extension, as is indicated in the representative embodiment described above with reference to FIG. 15.

The above techniques are intended to be embodied as one or more sequences of instructions, that is, a computer software or computer program product, that cause one or more processors or technical systems to perform the methods and transformations described herein. The computer software product can comprise executed object instructions and interpreted program code, or various scripting languages.

The computer software product can run on a stand-alone computer, for instance a computer system running Microsoft Windows NT (™), and is an plug-in to an existing computer aided design system, such as ProEngineer 2000i2 (™). However, in other embodiments, the processes can be separated in functionality. For instance, the extraction or export processes can run on a first computer system, while the creation or import processes can run on a second computer system. Further still, in another embodiment, a middleware system, operating in a server fashion (of a client-server system), can perform the processes either stand-alone (of course, using the APIs on either of two client systems), or as an intermediary between the various processes.

What is claimed is:

1. A method for computer implemented exchange of data between two distinct computer aided design systems, comprising:

selecting a particular operation from a feature list of a source computer aided design system;

comparing the particular operation to a match data record from a database, the match data record comprising an operation corresponding to the source computer aided design system and one or more operations corresponding to a target computer aided design system; and storing information corresponding to the match data record in a memory, the information representing a match with the particular operation from the feature list, wherein the match data record is used as a basis to construct a feature list for the target computer aided design system.

2. The method of claim 1, further comprising:

repeating the step of comparing for a plurality of subsequent operations from the feature list; and storing new information corresponding to a new match data record, the new information representing a plurality of matches with a plurality of operations from the feature list of the source computer aided design system.

3. The method of claim 2, further comprising removing one or more stored sets of information corresponding to one or more match data records from the memory when a current operation does not match an operation in a current match data record.

4. The method of claim 3, further comprising:

performing a property analysis on a feature created by the feature list in the target computer aided design system;

comparing the result of the property analysis with corresponding properties of the feature from the source computer aided design system; and rejecting the stored information corresponding to the match data record as invalid when the result of the property analysis are outside a threshold value.

5. The method of claim 2, further comprising:
performing a property analysis on a feature created by the feature list in the target computer aided design system;
comparing the result of the property analysis with corresponding properties of the feature from the source computer aided design system; and
rejecting the stored information corresponding to the match data record as invalid when the result of the comparison of the physical properties are outside a threshold value.

6. The method of claim 1, further comprising:
performing a property analysis on a feature created by the feature list in the target computer aided design system;
comparing the result of the property analysis with corresponding properties of the feature from the source computer aided design system; and
rejecting the stored information corresponding to the match data record as invalid when the result of the result of the property analysis are outside a threshold value.

7. A technical system for exchanging computer aided design data, the system comprising:
a source technical system comprising a source computer aided design data model;
a knowledge base comprising a plurality of match data records, the match data records having a source operation region, corresponding to the source technical system, and a target operation region; and
an executable computer program configured to:
retrieve information corresponding to a feature from the source computer aided design data model;
query the plurality of match data records based on the retrieved information; and
return information corresponding to a particular match data record in the plurality of match data records, the information representing one or more operations for creating an equivalent feature in a distinct computer aided design model to the feature from the source computer aided design data model.

8. The technical system of claim 7, further comprising a bridge data structure, the bridge data structure configured to hold information concerning the source computer aided design model and attributes of the process by which the source computer aided design model was modified.

9. The technical system of claim 8, further comprising a target technical system, the target technical system configured to utilize a target feature list created from the distinct computer aided design model.

10. The technical system of claim 9, wherein the executable computer program is further configured to:
perform a property analysis between the source computer aided design model and the distinct computer aided design model; and
reject the distinct computer aided design model when the property analysis reveals that properties between the source computer aided design model and the distinct computer aided design model outside an preset tolerance value.

11. The technical system of claim 8, wherein the executable computer program is further configured to:
perform a property analysis between the source computer aided design model and the distinct computer aided design model; and
reject the distinct computer aided design model when the property analysis reveals that properties between the source computer aided design model and the distinct computer aided design model outside an preset tolerance value.

12. The technical system of claim 7, further comprising a target technical system, the target technical system configured to utilize a target feature list created from the distinct computer aided design model.

13. The technical system of claim 7, wherein the executable computer program is further configured to:
perform a property analysis between the source computer aided design model and the distinct computer aided design model; and
reject the distinct computer aided design model when the property analysis reveals that properties between the source computer aided design model and the distinct computer aided design model outside an preset tolerance value.

14. The technical system of claim 7, further comprising a log file, the log file configured to remove information corresponding to one or more match data records from the distinct computer aided design model when a current match fails.

15. The technical system of any claim 7, wherein the knowledge base further comprises a computer aided design system matrix configured to hold pointers to one or more memory locations where the plurality of match data records are stored.

16. A computer readable medium having stored therein sequences of instructions for causing one or more processors to perform steps for computer implemented exchange of data between two distinct computer aided design systems, the steps comprising:
selecting a particular operation from a feature list of a source computer aided design system;
comparing the particular operation to a match data record from a database, the match data record comprising an operation corresponding to the source computer aided design system and one or more operations corresponding to a target computer aided design system; and
storing information corresponding to the match data record in a memory, the information representing a match with the particular operation from the feature list, wherein the match data record is used as a basis to construct a feature list for the target computer aided design system.

17. The computer readable medium of claim 16, the steps further comprising:
repeating the step of comparing for a plurality of subsequent operations from the feature list; and
storing new information corresponding to a new match data record, the new information representing a plurality of matches with a plurality of operations from the feature list of the source computer aided design system.

18. The computer readable medium of claim 17, the steps further comprising removing one or more stored sets of information corresponding to one or more match data records from the memory when a current operation does not match an operation in a current match data record.

19. The computer readable medium of claim 18, the steps further comprising:
performing a property analysis on a feature created by the feature list in the target computer aided design system;
comparing the result of the property analysis with corresponding properties of the feature from the source computer. aided design system; and rejecting the stored information corresponding to the match data record as invalid when the result of the property analysis are outside a threshold value.

20. The computer readable medium of claim 16, the steps further comprising:

performing a property analysis on a feature created by the feature list in the target computer aided design system;

comparing the result of the property analysis with corresponding properties of the feature from the source computer aided design system; and rejecting the stored information corresponding to the match data record as invalid when the result of the result of the property analysis are outside a threshold value.

* * * * *